(12) United States Patent
Fujita et al.

(10) Patent No.: US 7,371,687 B2
(45) Date of Patent: May 13, 2008

(54) ELECTRONIC CIRCUIT DEVICE

(75) Inventors: Ryo Fujita, Hitachi (JP); Osamu Kubo, Hitachi (JP); Kouki Noguchi, Tokyo (JP); Masaharu Kubo, Hachioji (JP); Michihiro Mishima, Kunitachi (JP); Yasuhiko Takahashi, Higashiyamato (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 11/475,961

(22) Filed: Jun. 28, 2006

(65) Prior Publication Data

US 2006/0237835 A1 Oct. 26, 2006

Related U.S. Application Data

(63) Continuation of application No. 10/466,300, filed as application No. PCT/JP01/00326 on Jan. 19, 2001, now Pat. No. 7,091,598.

(51) Int. Cl.
H01L 23/52 (2006.01)

(52) U.S. Cl. ............ 438/691; 257/693; 257/697; 257/E23.07; 257/E23.02

(58) Field of Classification Search ........ 257/693, 257/697, 701, 702, 723, E23.07, E23.016, 257/E23.02, 691
See application file for complete search history.

(56) References Cited

U.S. PATENT DOCUMENTS

| | | | | |
|---|---|---|---|---|
| 5,687,358 A | 11/1997 | Saito et al. | ............ | 395/551 |
| 5,898,846 A | 4/1999 | Kelly | ............ | 395/284 |
| 6,157,205 A * | 12/2000 | Swanson | ............ | 326/30 |
| 6,452,113 B2 * | 9/2002 | Dibene et al. | ............ | 174/260 |
| 6,457,155 B1 | 9/2002 | Dell et al. | ............ | 714/773 |

(Continued)

FOREIGN PATENT DOCUMENTS

JP 61-235953 4/1985

(Continued)

OTHER PUBLICATIONS

International Search Report from the Japanese Patent Office, dated Apr. 3, 2001.

Primary Examiner—Caridad M. Everhart
(74) Attorney, Agent, or Firm—Reed Smith LLP; Stanley P. Fisher, Esq.; Juan Carlos A. Marquez, Esq.

(57) ABSTRACT

An electronic circuit device has a high-density mount board (2), on which are disposed a microcomputer (3) and random access memory (7) which are connected to each other through an exclusive memory bus (12) for high-speed data transfer, a programmable device (8) which is a variable logic circuit represented by FPGA, and an electrically-rewritable nonvolatile memory (16) which can store the operation program of the microcomputer. The high-density mount board has external mounting pins on the bottom surface so that it can be mounted on a mother board in the same manner as a system on-chip multi-chip module. With an intended logic function being set on the programmable device, a hardware-based function to be realized by the electronic circuit device can be simulated. With an operation program being written to the nonvolatile memory, a software-based function to be realized can be simulated. Consequently, the device facilitates the debugging at early stages of system development, configures a prototype system, and contributes to the time reduction throughout the system development, prototype fabrication and large-scale production.

7 Claims, 18 Drawing Sheets

U.S. PATENT DOCUMENTS 6,836,847 B1 * 12/2004 Zinger et al. .................. 726/19
6,979,841 B2 * 12/2005 Ohtani ......................... 257/72

FOREIGN PATENT DOCUMENTS

| JP | 62-102172 | 10/1985 |
| JP | 05-341940 | 6/1992 |
| JP | 08-101255 | 9/1994 |
| JP | 08-167703 | 10/1995 |
| JP | 11-265299 | 3/1998 |
| JP | 2000-049287 | 7/1998 |
| JP | 2000-131389 | 10/1998 |

* cited by examiner

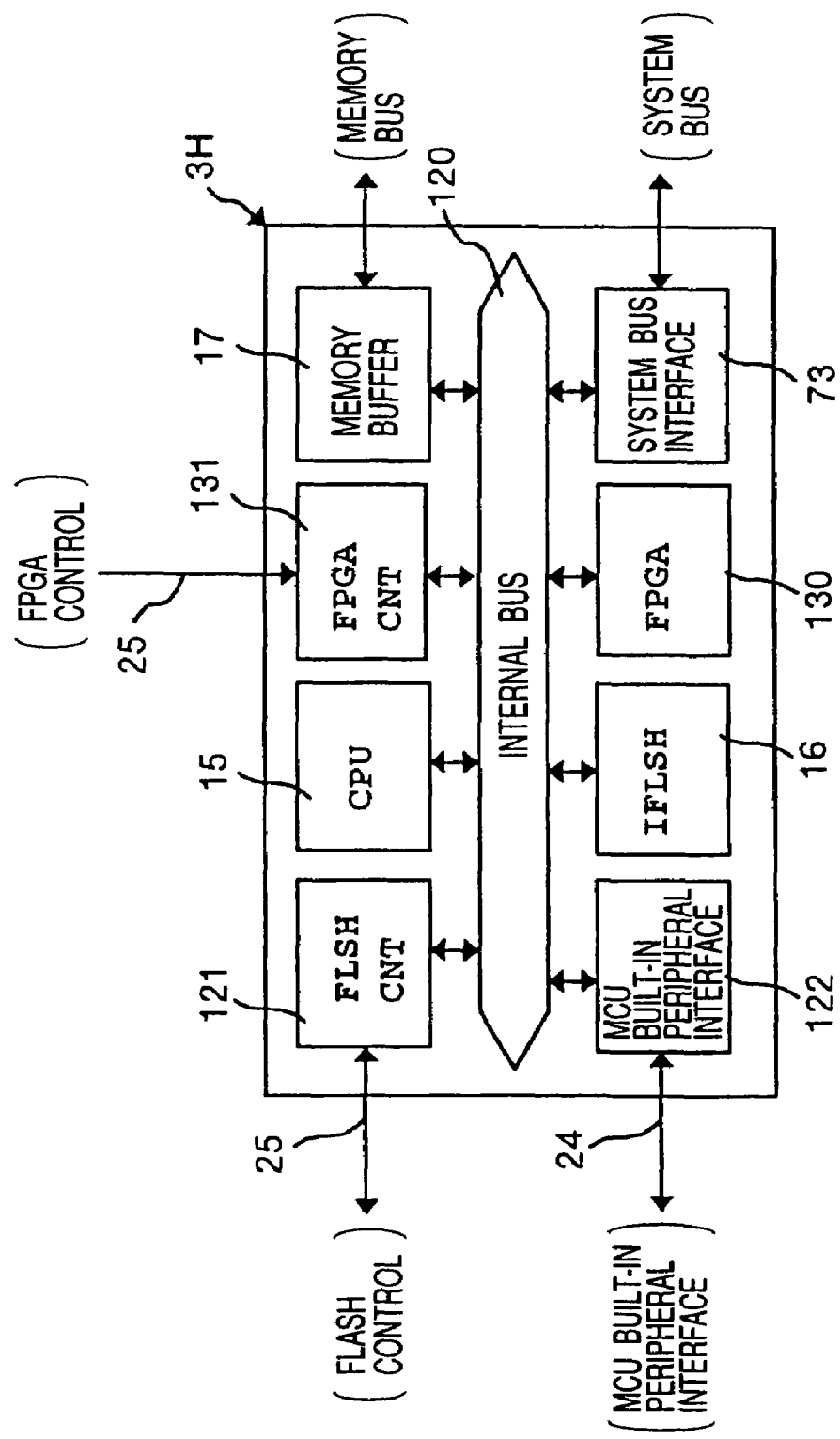

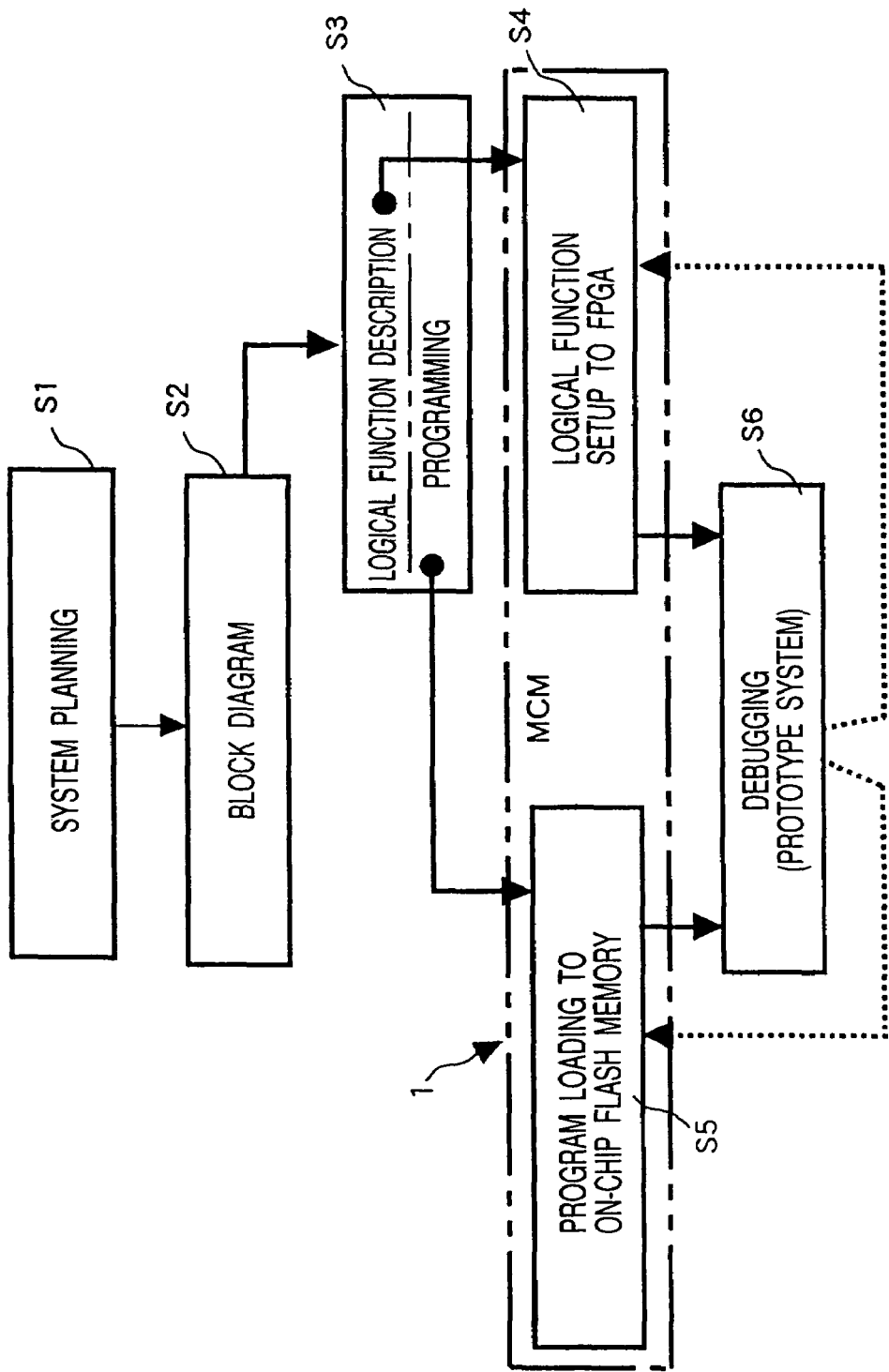

ELECTRONIC CIRCUIT DEVICE

CROSS-REFERENCE TO RELATED APPLICATIONS

This application is a Continuation application of U.S. application Ser. No. 10/466,300 filed Jul. 15, 2003 now U.S. Pat. No. 7,091,598. Priority is claimed based on U.S. application Ser. No. 10/466,300 filed Jul. 15, 2003, which claims the priority of PCT/JP2001/00326 filed Jan. 19, 2001, all of which is incorporated by reference.

TECHNICAL FIELD

The present invention relates to an electronic circuit device having MCM (Multi-Chip Module) structure, and to a technique which is applicable effectively to, for example, an electronic circuit device used for the debugging at early stages of SOC (System On Chip) or MCM-oriented system development and also for the configuration of a prototype system.

BACKGROUND ART

Semiconductor integrated circuit devices (LSI) which are amid the trends of enhancement in integration density and performance are encountering the design complexity. For an LSI user who plans to develop an application system, it will take in many cases as long as one year before having a complete LSI. The longer development time is disadvantageous to responding quickly to market demands. In order to reduce the development time, it is crucial to find problems at early stages of design.

The MCM scheme deserves considering for alleviating the design complexity of LSI and realizing an intended electronic circuit device in a relatively short time. The MCM scheme is to mount LSI chips such as a microprocessor and memory on a high-density build-up board, so that a resulting electronic circuit device is comparable in performance to an SOC-based LSI.

For preparing an electronic circuit device to make an intended system in a relatively short time or for preventing in advance problems of an LSI to be design, the use of an FPGA (Field Programmable Gate Array) is effective. The FPGA implements a designed logic function at an early stage, enabling the finding of functional problems and the swift solution of the problems. For example, an intended logic function, such as the compressive communication protocol, is implemented by loading connection definition data into numerous memory cells of the FPGA, and it is operated to debug the logic function based on the operation result. The FPGA provides per se the intended logic function, or it enables the faster LSI design based on its capability of debugging LSI logic function at early stages.

The CPU operation program can be revised in case it is stored in an electrically-rewritable nonvolatile memory such as a flash memory, allowing slight alterations of the system design promptly. A microcomputer which provides this facility is called FPMC (Field Programmable Micro-Computer).

The inventors of the present invention have studied the organic combination of the MCM, FPGA and FPMC techniques for the debugging at early stages of SOC-based system development and for the configuration of a prototype system. However, such a scheme is yet to be offered.

The inventors of the present invention have revealed problems during the study as follows.

Firstly, the separate use of MCM and FPGA necessitates a larger board for mounting them and a longer wiring, and consequently in some cases does not behave the intended characteristics for implementing the function equivalent to an SOC-based LSI.

Secondly, in the case of implementing high-speed data transfer on the MCM, unmatching of characteristic impedance of the wiring has a larger influence of signal reflection as compared with the board of MCM, and it will be occasionally desirable to tune the output impedance to the output circuit of LSI.

Thirdly, for the case of face-down mounting of surface-mount semiconductor integrated circuits on a high-density board such as a build-up board, it is desirable to simplify the line connection test for the circuits on the mount board and the testing of the mounted circuits.

Fourthly, in order to speed up the data processing, it is necessary to speed up the data transfer between the microcomputer and the memory. The inventors of the present invention have noticed afterward the presence of Japanese Patent Unexamined Publication No. He. 8-167703. However, the invention described in the above-mentioned patent publication is intended to form a DRAM (dynamic RAM) on two semiconductor chips by dividing it into a memory cell section and a logic circuit section, with both chips being interconnected on the mount board, and this invention differs completely from the present invention from the viewpoint of semiconductor element structure as will be appreciated from the following detailed explanation.

It is an object of the present invention to provide an electronic circuit device which is capable of facilitating the debugging at early stages of SOC-based system development and also configuring a prototype system.

Another object of the present invention is to provide an electronic circuit device which is capable of altering the logic function and also speeding up the data transfer for data processing.

Still another object of the present invention is to provide an electronic circuit device which is capable of readily alleviating the signal reflection attributable to the unmatching of characteristic impedance of the wiring in accomplishing the high-speed data transfer.

Still another object of the present invention is to provide an electronic circuit device which is capable of dealing with the case of face-down mounting of surface-mount semiconductor integrated circuits on a high-density board such as a build-up board by facilitating the wiring connection test for the circuits on the mount board and the testing of the mounted circuits.

These and other objects and novel features of the present invention will become apparent from the following description and accompanying drawings.

DISCLOSURE OF THE INVENTION

Summary:

Among the affairs of the inventive electronic circuit device, representatives are briefed as follows. On a high-density board such as a build-up board, a microcomputer (MCU) and a random access memory (RAM), e.g., DRAM, are mounted, and these components are connected to each other through an exclusive memory bus so as to perform high-speed data transfer. Further mounted on the high-density board is a programmable logic circuit device which is typically an FPGA and is capable of simulating the peripheral function of the microcomputer. The microcomputer incorporates an electrically-rewritable nonvolatile memory so that it can alter the operation program when necessary. The high-density board is, for example, a daughter board to be mounted on a mother board, and has external mounting pins on the bottom surface so that it can be mounted on the mother board in the same manner as a system-on-chip-based MCM.

This electronic circuit device, which is based on the organic combination of the MCM, FPGA and FPMC techniques, facilitates the debugging at early stages of SOC-based system development without imposing operational speed and noise problems, and is also useful for the configuration of a prototype system. It contributes to the time reduction throughout the system development, prototype fabrication and large-scale production. The electronic circuit device, when it is intended to be a commercial product to replace a SOC-based LSI, is advantageous overwhelmingly in terms of cost reduction, particularly in the case of small-quantity large-variety production, and it is comparable to SOC in terms of performance and board size.

The inventive electronic circuit device will be summarized in more detail from several viewpoints.

<Programmable Logic Function>

The electronic circuit device has semiconductor devices including a microcomputer with CPU, a random access memory and a programmable device which implements a logic function in accordance with logic definition information such as wiring definition data and logic definition data loaded in numerous memory cells.

The microcomputer, random access memory and programmable device are formed on separate semiconductor chips, which are mounted on one side of a common board, with another side thereof having external mounting pins for the connection with other circuit board. The external mounting pins are adapted to connect to the programmable device.

By setting an intended logic function to the programmable device based on logic definition data, the function, particularly the hardware-based function, to be realized by the electronic circuit device can be implemented. The device can facilitate the debugging at early stages of system development and also configure a prototype system.

<Programmable Operation Program>

The microcomputer can have a first nonvolatile memory which can hold and rewrite electrically the operation program of CPU. In consequence, the function to be realized can be simulated on a software basis, and the device can facilitate the debugging and configure a prototype system.

<Programmable Device as CPU Peripheral Circuit>

The common board can have a common bus for the connection between the microcomputer and the programmable device. The common bus enables the microcomputer, or its CPU, to operate on the programmable device so as to function as a peripheral circuit through the common bus.

<Programmable Control Data>

The common board can have a second electrically-rewritable nonvolatile memory, which is mounted on it and connected to the common bus. This nonvolatile memory is rendered the programmable setting of control data tables to be referenced by the microcomputer or its CPU in carrying out the system debugging.

<Sped-Up Memory Access>

The microcomputer is designed to include a memory buffer, for example, so as to be adaptive to the MCM design. The memory buffer is connected to the random access memory through the exclusive memory bus on the common board. The exclusive memory bus is not connected to the external mounting pins of the common board so that it is prevented from having an excessive duty that can obstruct the high-speed memory access, although this affair is not compulsory. Adopting the memory buffer and exclusive memory bus enables easy optimization of the number of bits of the bus, the signal amplitude on the bus and the bus driving scheme to the random access memory used, and enables precise response to the demand of speed-up.

The memory buffer has an output buffer for the connection to the exclusive memory bus. The output buffer includes an output MOS transistor and output impedance controlling MOS transistor connected to the output MOS transistor. The output impedance controlling MOS transistor has its gate electrode receiving a control voltage which is put out from a control circuit with the ability of voltage generation, so that it undergoes impedance control. The output impedance controlling MOS transistor is actually made up of, for example, multiple MOS transistors in parallel connection, and has its conduction resistance determined from the number of transistors in the turn-on state. Based on the mutual impedance matching by offsetting of the variation of output impedance of the output buffer of the semiconductor integrated circuit and the variation of characteristic impedance of the exclusive memory bus and other lines on the common board, the creation of undesirable signal components caused by signal reflection or the like can be alleviated so that high-speed memory access is made possible.

<High-Density Mount Board>

The common board which realizes a high-density mount board such as a build-up board is formed of a glass substrate, with one side thereof having a formation of multi-wiring-layers and a disposition of semiconductor device mounting pins which are conductive to certain lines of layers. Disposed on the other side of the glass substrate are the external mounting pins described previously which penetrate the glass substrate and are conductive to certain lines of layers. Semiconductor devices including a microcomputer, random access memory and programmable device to be mounted on the high-density mount board are prepared in the form of, for example, surface-mount bare chips having their external pins such as micro-bumps arrayed on the bottom or chips which are packaged based on the CSP (chip size package) technique, and these devices are mounted face-down on the device mounting pins of the high-density mount board.

The high-density mount board of glass substrate is preferable due to its property of warping and dimensional change as small as silicon chips of devices and also of low cost. The glass substrate undergoes the formation of conductive films and insulation films based on the film forming processes and small multi-wiring-layer patterns and thru-holes based on the photolithographic process. Based on these film forming and patterning processes similar to the semiconductor chip forming processes, electronic component parts including semiconductor devices can be mounted densely on the mount board.

The high-density mount board becomes a common build-up board for mounting multiple semiconductor devices on its one side where the multi-wiring-layers are formed. The build-up board has on its another side external pins which are used to mount the board on other circuit board. Besides the glass substrate, a ceramic board which is small in thermal deformation or an organic resin board which is heat resistive can be used for the high-density mount board.

<JTAG-Based Test Function>

The following assumes that semiconductor devices have their own boundary scanning function or built-in test function based on the JTAG (Joint Test Action Group) of IEEE standard 149.1. All or part of the multiple semiconductor devices connect their internal scanning latches in series in response to the input signal entered to a test control pin, and can operate as a shift register connected between an external test data input pin and test data output pin, thereby implementing the boundary scanning function or built-in test function.

In order to use this function of these semiconductor devices, the build-up board has a common test control pin which is connected in parallel fashion to the test control pins of the semiconductor devices, a common test data input pin, a common test data output pin, and a selection control circuit. The selection control circuit operates in response to a mode control signal to select between a serial connection state in which the test data output pin of one semiconductor device is connected to the test data input pin of another device so that all semiconductor devices are connected in series between the common test data input pin and the common test data output pin, and a separate connection state in which the test data output pin and test data input pin of each semiconductor device are connected to the common test data input pin and the common test data output pin individually.

After a semiconductor device is mounted face-down on the build-up board, it is difficult to observe optically the state of pin connection between the device and the board. On this account, the JTAG scheme is used suitably for the verification of mount state. Specifically, a tester issues a mode control signal to the build-up board, so that the selection control circuit selects the serial connection state. The tester feeds test data to the external pins of semiconductor devices on the build-up board, and corresponding scanning latches of the devices hold the data placed on the external pins. The shift register of scanning latches operates to send the shifted data back from the common test data output pin to the tester, and the electrical connection between the semiconductor devices and the build-up board can be checked on a match/mismatch basis between the test data and the returned data.

The JTAG scheme is used suitably for the debugging of electronic circuit device. Specifically, an electronic circuit device is operated by a proper external controller such as an emulator, and the selection control circuit is operated to select the separate connection state. The scanning latches of the subject semiconductor device latch sample data, and the shift register of scanning latches operates to shift the latched data out from the common test data output pin to the external controller, which analyzes the data.

It is possible for the electronic circuit device with the provision of the JTAG-based test function to adopt the high-density mount board structure of the build-up board. The semiconductor devices may be each equipped with a microcomputer with CPU and a random access memory, with the microcomputer being adapted to connect to the external mounting pins. If the microcomputer incorporates a first electrically-rewritable nonvolatile memory which can store the operation program of CPU, it becomes possible to simulate on a software basis the function to be realized by the electronic circuit device. By the provision of the microcomputer with a memory buffer, which is connected to the random access memory through the exclusive memory bus, it is possible to speed up the memory access as in the case described previously. Arranging the output circuit of memory buffer so as to be variable in output impedance, as in the previous case, facilitates the impedance matching with the exclusive memory bus. Moreover, using the above-mentioned programmable device as one of semiconductor devices facilitates the hardware-based simulation of the function to be realized by the electronic circuit device.

<Externally Attached Programmable Device>

The electronic circuit device according to still another aspect of this invention includes a programmable device which is externally attached to the mother board of the electronic circuit device. Although the external attachment of device is disadvantageous from the viewpoints of increased wiring length and system size, it can reduce the cost of daughter board. In addition, the electronic circuit device can fit flexibly to extensive logical sizes to be accomplished based on FPGA.

More specifically, the electronic circuit device has a daughter board which mounts a microcomputer and a random access memory, and a mother board mounts the daughter board and a programmable device which implements a logic function in accordance with logic definition data loaded in numerous memory cells. The microcomputer and random access memory are formed on separate semiconductor chips, which are mounted on one side of the daughter board, with another side thereof having external mounting pins used for the mounting on the mother board. The external mounting pins are connected to the microcomputer on the daughter board.

Also in this arrangement, the microcomputer may incorporate a first electrically-rewritable nonvolatile memory for loading the operation program, or the microcomputer may incorporate a memory buffer which is connected to the random access memory through the exclusive memory bus. The memory buffer may employ an output circuit of variable output impedance.

BRIEF DESCRIPTION OF DRAWINGS

FIG. 18 is a block diagram of an MCU having a built-in FPGA and flash memory; and FIG. 19 is a flowchart showing in brief the development procedures from the planning of development of an electronic circuit device until the fabrication of a prototype system.

BEST MODE FOR CARRYING OUT THE INVENTION

Figure 1:
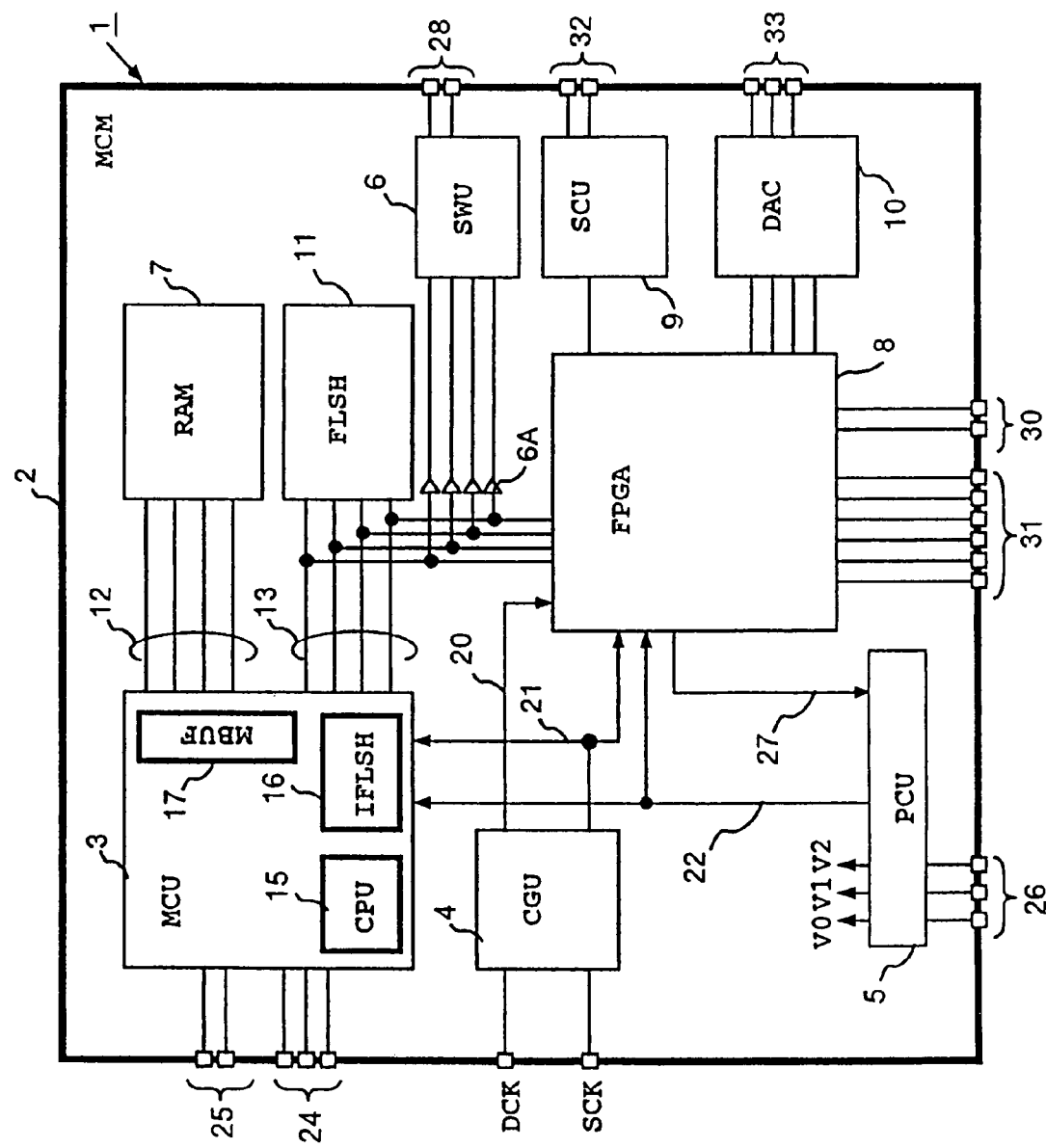
FIG. 1 is a block diagram of an MCM which is a first embodiment of the inventive electronic circuit device.

FIG. 1 shows an MCM 1 which is the first embodiment of the inventive electronic circuit. This MCM 1 is intended in this example for the application to a system that is oriented to graphic control inclusive of display, imaging and data compression, although this affair is not compulsory.

The MCM1 includes semiconductor devices formed on one side of a high-density mount board 2, which are a microcomputer (MCU) 3, clock generation unit (CGU) 4, power control unit (PCU) 5, switch unit (SWU) 6, random access memory (RAM) 7, programmable device (FPGA) 8, serial communication unit (SCU) 9, digital-to-analog converter (DAC) 10, and flash memory (FLSH) 11. The random access memory 7 is connected to the microcomputer 3 through an exclusive memory bus 12. The microcomputer 3, FPGA 8 and flash memory 11 share a common system bus 13.

The CGU 4 having inputs of a system clock signal SCK and display clock signal DCK multiplies or demultiplies the frequencies of these clock signals to release a resulting display timing clock signal 20 and reference clock signal 21 to the FPGA 8 and to the MCU 3 and FPGA 8, respectively.

The MCU 3 includes a CPU 15, on-chip flash memory (IFLSH) 16 and memory buffer (MBUF) 17. The on-chip flash memory 16 is an electrically rewritable nonvolatile memory for storing the operation program of the CUP 15. The CUP 15 fetches commands from the flash memory 16, RAM 7 or external flash memory 11 in accordance with a prescribed control sequence, and decodes and executes each command. The memory buffer 17 is connected to the exclusive memory bus 12 in compliance with the interface norm specific to the RAM 7.

The MCU 3 starts the reset operation in response to the rise of a system reset signal 22 from the PCU 5, and starts the operation in synchronism with the reference clock signal 21 from the CGU 4 in response to the fall of the signal 22. The MCU 3 can interface with the outside of the high-density mount board 2 via peripheral interface pins 24 and program pins 25 so that the on-chip flash memory 16 can be rewritten from the outside of the high-density mount board 2 by way of a control unit (not shown) in the MCU 1, although this affair is not compulsory. Namely, the MCU 3 is designed such that the on-chip flash memory 16 is made accessible from the outside through the interface pins 24 and control unit (not shown) in response to the instruction of program mode from the program pins 25, and the MCM 1 is rewritten from the outside in this state.

The PCU 5 controls power and also controls the reset operation. Specifically, it receives the power voltage from the outside through external power pins 26, and steps up or down the power voltage to produce internal power voltages V0, V1 and V2 to be used on the mount board 2. For example, the MCU 3, etc. are supplied with internal power voltages of 1.8 V and 3.3 V, and the SCU 9 and DAC 10 are supplied with an internal power voltages of 12 V. The PCU 5 monitors as its reset control function the program-end signal 27 from the FPGA 8 and the external power. When the external power voltage is stable, it turns on the reset signal 22 in response to the rise of the program-end signal 27, and it turns off the reset signal 22 on expiration of a prescribed time to initiate the operation of the MCU 3 and FPGA 8.

The SWU 6 selects subject signals on the mount board 2 and conducts the signals to monitor pins 28 at the time of debugging. In the example of FIG. 1, the system bus 13 is connected to the SWU 6 through buffers 6A so as to minimize the load to the bus. Signals to be selected by the SWU 6 is determined by the MCU 3, which sets selection control data to the control register (not shown) of SWU 6 through the system bus 13 prior to the monitoring operation.

The RAM 7 is a dynamic memory such as a DRAM or synchronous DRAM, or a static memory such as an SRAM. The memory buffer 17 has a compatible interface in terms of signal level with the RAM 7 for transacting the address, data and access control command signals. Access control command signals include the clock enable signal, memory enable signal, row address strobe signal, column address strobe signal, write enable signal and output enable signal in the case of an SDRAM for example.

The FPGA 8 includes in matrix arrangement many signal buses, many variable switch cells for the selection of signal buses and many variable logic cells, although this affair is not compulsory. The logic function of the variable logic cells and the manner of connection between the variable switch cells and the signal buses are determined by logic definition data (or logic function definition data) held in the data latch circuit, and the manner of connection of the signal buses by the variable switch cells is determined by logic definition data held in the data latch circuit. The data latch circuit is formed of static latches or nonvolatile memory cells. The data latch circuit is initialized to hold logic definition data, by which the logical structure of FPGA 8 which simulates the hardware operation is determined. The logic function of the FPGA 8 can be changed by altering the logic definition data. The FPGA 8 reads in logic definition data from a program port 30, and thereafter issues the program-end signal 27 to the PCU 5, which then turns on the reset signal 22.

In the embodiment shown in FIG. 1, which is designed to set to the FPGA 8 a logic function pertinent to display, the FPGA 8 has connections with the outside of the mount board 2 through a PCI (Peripheral Component Interconnect) bus pins 31, serial pins 32 via the SCU 9, and analog pins 33 via the DAC 10. The serial pins 32 can be used for the communication with external switches and keyboard (not shown) and the analog pins 33 can be used for the release of display data and display timing signals to an external CRT or LCD display unit (not shown), for example.

The SCU 9 is controlled by the MCU 3 by way of the FPGA 8 to communicate with input/output devices such as the switches and keyboard (not shown).

The DAC 10 receives display data from the FPGA 8 in synchronism with the display clock signal and converts the data into analog display signals. It generally releases luminance signals of red, green and blue (RGB signals) and horizontal/vertical syc signals which are superimposed on the green signal.

The mount board 2 may mount passive elements such as capacitors and resistors (not shown).

The arrangement shown in FIG. 1 is intended for the debugging at system development, although this affair is not compulsory. At large-scale production following debugging, the flash memory 11 is replaced with a ROM and the FPGA 8 is replaced with a custom LSI of a gate array or ASIC (Application Specific Integrated Circuit) which is equivalent in function to the FPGA 8. The SWU 6 may be eliminated. Alternatively, the arrangement of FIG. 1 may be finished following the debugging and put on the market intact. In this case, a read-only memory (ROM) or a nonvolatile memory such as a flash memory for storing logic definition data of the FPGA 8 is added on a mother board 46 (refer to FIG. 2) where the MCM 1 mounted. The stored data is loaded into the FPGA 8 when the system is turned on. Alternatively, the logic definition data of the FPGA 8 may be stored fixedly in the flash memory 11 and loaded into the FPGA 8 when the system is turned on.

Next, the program to be stored in the internal flash memory 16 for the debugging at the system development using the MCM 1, and the operation at the debugging of the logic function implemented by the FPGA 8 will be explained.

After the system is turned on and logic definition data is put in through the FPGA program port 30, the FPGA 8 has its logical structure established, and the PCU 5 issues the reset signal 22 so that the entire MCM 1 is reset. When the reset signal 22 is turned off, the MCU 3 responds to the instruction of program mode from the program pin 25 to enable the on-chip flash memory 16 to write in a subject program of debugging which is put in through the peripheral interface pins 24. The MCU 3 can rewrite the operation program of the on-chip flash memory 16 at this time when necessary by operating on the CPU 15 to run the rewrite control program. The rewrite control program is stored in advance in the flash memory 11, and it is initiated by the interrupt function of the CPU 15.

In order to sample bus data and other internal data from the outside at the execution of subtract program by the CUP 15, a debug control program is run by the CUP 15 prior to the subject program so that the control register of the SWU 6 is initialized to hold data which specifies data to be sampled. In consequence, when the CUP 15 is running the subject program, the specified sample data is put out from the SWU 6 to the monitor pin 28. An external logic analyzer receives the output data to analyze the waveform.

Figure 2:
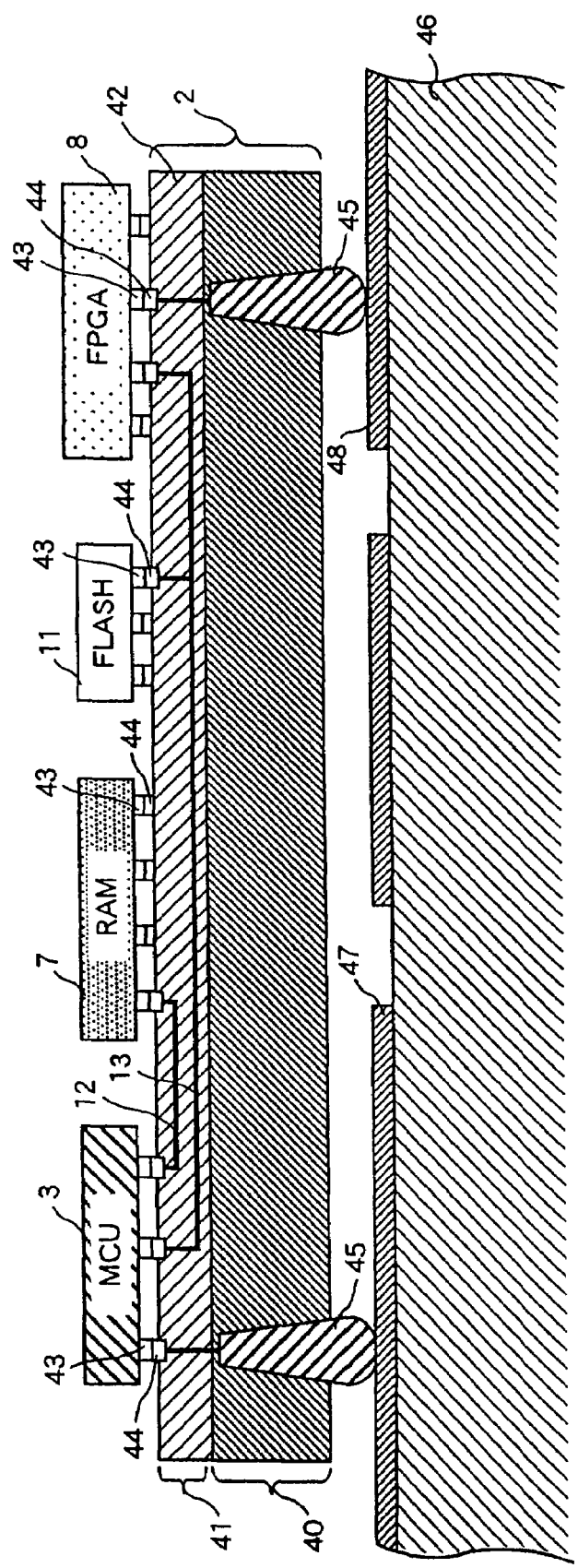
FIG. 2 is a longitudinal cross-sectional diagram showing briefly the cross-sectional structure of the MCM shown in FIG. 1.

FIG. 2 shows in brief the cross-sectional structure of the MCM 1 shown in FIG. 1. The high-density mount board 2 is formed of a glass substrate 40, with multi-wiring-layers 41 being formed on one side thereof, and it functions as a build-up board or compound wiring board. The multi-wiring-layers 41 include lines 12 and 13 which run in the x and y directions by being insulated by an insulation layer 42. Semiconductor devices such as the MCU 3 have external bump electrodes 43 on their one side so as to be adaptive to surface mounting. The semiconductor devices may be fabricated in the same manner as usual bare chips having bump electrodes, or may be fabricated through the processes of forming circuit elements, wiring lines, passivation films and bump electrodes on a wafer and dicing the wafer into semiconductor chips.

Formed on the top surface of the multi-wiring-layers 41 are bump electrodes 44 which function as mounting pins having electrical connection with certain lines of layers. The semiconductor devices are mounted on the high-density mount board 2 based on the face-down bonding technique. Specifically, bump electrodes 43 of semiconductor devices are joined to bump electrodes 44 of the high-density mount board 2. The glass substrate 40 has bump electrodes 45 as external mounting pins which penetrate the substrate from the bottom surface and connect electrically to certain lines of multi-wiring-layers 41. The high-density mount board 2 is, when necessary, mounted on a mother board 46 by having its bump electrodes 45 connected mechanically and electrically to land patterns 48 of wiring lines 47 as shown in FIG. 2.

The bump electrodes 44 of the high-density mount board 2 are sized and spaced from each other so as to be correspondent to the bump electrodes 43 of semiconductor devices. The bump electrodes 45 are larger in size and spacing as compared with the bump electrodes 43 and 44. The smaller bump electrodes 44 of the high-density mount board 2 will be called here "micro-bumps" in contrast to the larger bump electrodes 45.

Figure 3:
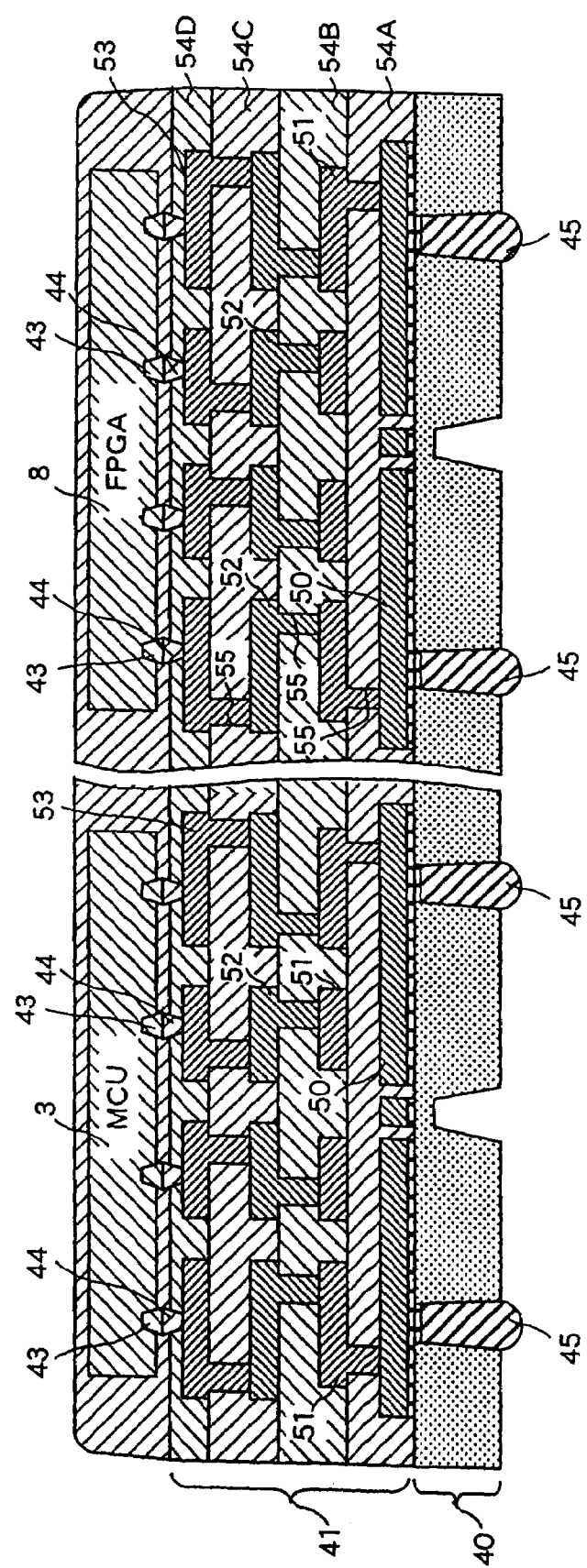
FIG. 3 is a longitudinal cross-sectional diagram showing in detail the structure of multi-wiring-layers in the cross section of the MCM.

FIG. 3 shows in detail the multi-wiring-layers 41 in the cross section of the MCM 1. The multi-wiring-layers 41 include wiring lines 50-53 of four layers for example, which are separated from each other by interposing insulation films 54A-54D and connected with each other to make circuits by thru-holes 55 which are formed in the insulation films 54A-54D.

The glass substrate 40 is made of non-alkaline glass used for the TFT liquid crystal substrate or boron silicate glass used for the semiconductor optical sensor, and it has a thickness of around 0.5 mm for example. The wiring lines 50-53 are made of metal such as aluminum (Al), copper (Cu) or tungsten (W). The insulation films 54A-54D are formed of silicon oxide films or polyamide films, for example. The lowermost wiring lines 50 have a width and spacing of 10-30 μm, while the uppermost wiring lines 53 have a width and spacing of 1-10 μm. The micro-bumps 43 and 44 are gold (Au) bumps or tin (Sn) bumps having a diameter of around 5-100 μm. The bump electrodes 45 are made of solder or the like having a lower fusing point relative to the micro-bumps 43 and 44, and have a diameter of several hundreds micrometers for example.

The wiring lines 50-53, thru-holes 55 and micro-bumps 43 and 44 can be formed to have accurate dimensions based on the photolithographic process. The wiring lines 50 are formed by deposition on an adhesive layer on the glass substrate 40 by the sputtering process, and by the subsequent patterning process with photoresist films. The upper wiring lines 51-53 can also be formed by the sputtering and patterning processes. The insulation films 54A-54D can be formed by the CVD (Chemical Vapor Deposition) process in the case of silicon oxide films, or by the film material application process in the case of polyamide films. The micro-bumps 44 can be deposited by the evaporation process for example. The micro-bumps 45 can be formed by drilling through the glass substrate 40, attaching barrier metal at the end of holes, applying solder in the form of solder balls or based on the screen print scheme, and reflowing the solder.

As described above, the high-density mount board 2 which is intended for MCM of this embodiment has on one side relatively small connection pins (bump electrodes or micro-bumps 44) which correspond in position to the external connection pins (bump electrodes or micro-bumps 43) of semiconductor devices and multi-layer wiring lines which are connected with the connection pins of the board 2, and has relatively large external connection pins (bump electrodes 45) on the other side.

Figure 4:
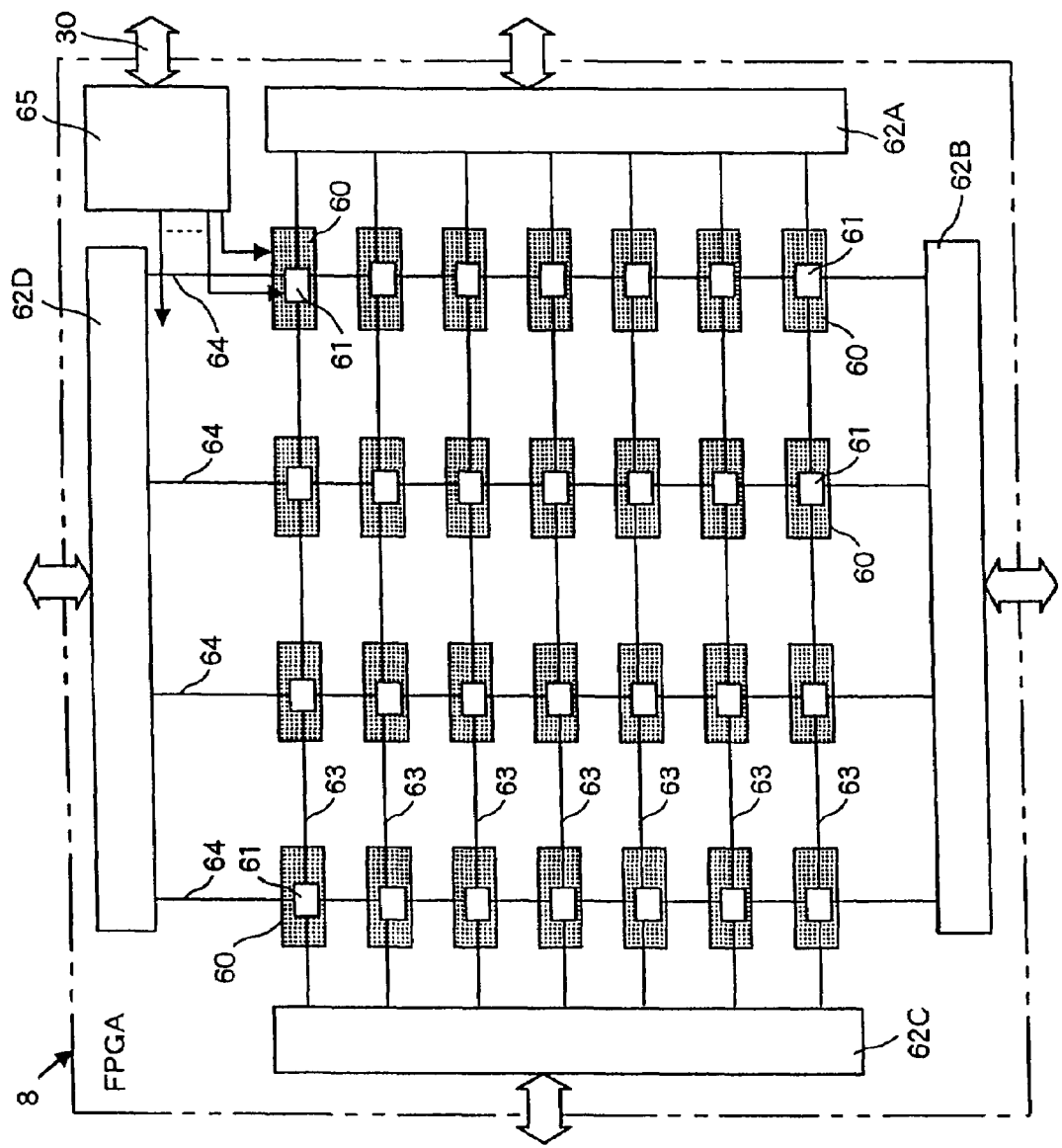
FIG. 4 is a block diagram showing the details of an FPGA.

FIG. 4 shows an example of the arrangement of the FPGA 8. The FPGA 8 includes, in matrix arrangement on a semiconductor substrate of monocrystalline silicon or the like, several variable logic units 60, variable connection units 61, variable external input/output circuits 62A-62D, several signal lines 63 running in the row direction, several signal lines 64 running in the column direction, and a program control circuit 65.

The variable logic units 60, variable connection units 61 and variable external input/output circuits 62A-62D each include variable switch cells, variable logic cells and a data latch circuit. The logic function of the variable logic cells and the connecting manner between the variable logic cells and signal buses by the variable switch cells are determined in accordance with the logic definition data held in the data latch circuit which is controlled for data loading by the program control circuit 65.

Figure 5:
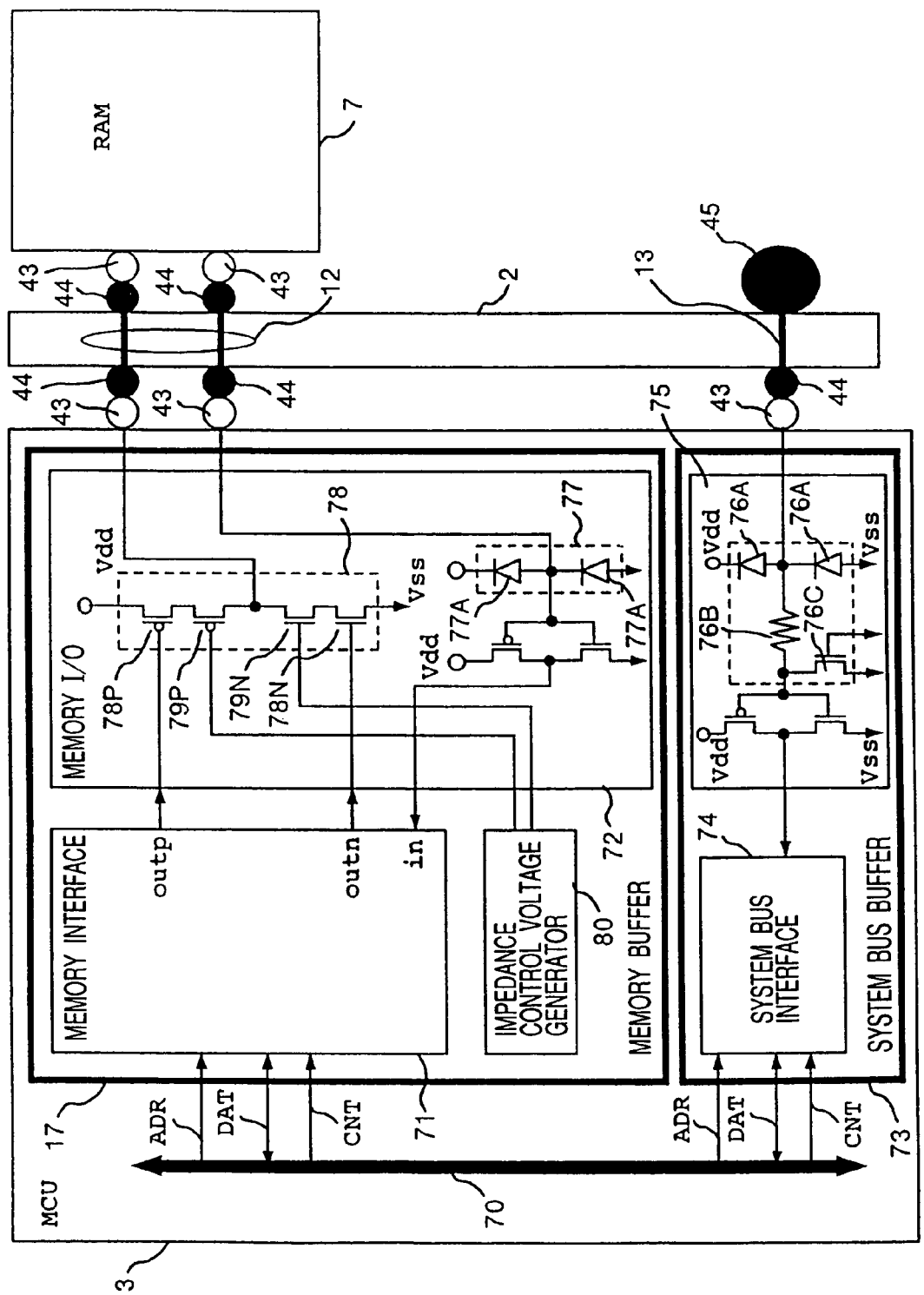
FIG. 5 is a schematic circuit diagram showing in detail the arrangement of the memory buffer in the MCM.

FIG. 5 shows an example of the arrangement of the memory buffer 17 in the MCU 3. The memory buffer 17 is connected with the address signal lines ADR, data signal lines DAT and control signal lines CNT included in the internal bus 70 of the MCU 3, and it operates on its memory interface 71 to check the address of RAM 7 and delivers the address, data and control signals to the RAM 7 via a memory I/O circuit 72 in response to an affirmative check result.

The system bus buffer 73 is also connected with the address signal lines ADR, data signal lines DAT and control signal lines CNT of the internal bus 70, and it operates on its system interface 74 to check the address on the bus 70 and delivers the address, data and control signals to the outside of the mount board 2 via the system bus I/O circuit 75 in response to an affirmative check result.

In FIG. 5, small black circles attached to the mount board 2 indicate the micro-bumps 44 on the mount board 2, and a white circle indicates the micro-bumps 43 of semiconductor devices mounted on the board.

It is recommended to take counter measures against extraneous electrostatic surges caused by the friction and the like for the solder bumps 45 which are connected to the outside of the mount board 2. Accordingly, the I/O circuit 75 in the system bus buffer 73 includes an ESD (Electrostatic Discharge) circuit 76 made up of two diodes 76A, a resistor 76B and a MOS transistor 76C.

In contrast, for the memory bus 12 which is confined on the mount board 2 and is not subjected to extraneous influence, the input buffers of the memory I/O circuit 72 can have a simple ESD circuit 77 made up solely of small diodes 77A.

Due to the provision of the very compact ESD circuit 77 for the memory bus 12, it is allowed to have a smaller input capacitance, and consequently the MCU 3 can be reduced in power consumption and chip area and enhanced in data transaction speed.

Due to the compact ESD circuit 77 having the smaller input capacitance and the wiring lines which are confined on the mount board 2 to have the smaller resistance and capacitance, the influence of signal reflection appears to be pronounced. On this account, there is employed an output buffer 78 for impedance control of each output signal as shown in the memory I/O circuit 72. Each output signal released from the MCU 3 and put in to the RAM 7 is controlled to be one of logical "1", logical "0" or high-impedance state in response to signals outp and outn which are released from the memory interface 71. Specifically, the signal outp is put in to the gate of a MOS transistor 78P having its source pulled to the power voltage Vdd, and the signal outn is put in to the gate of another MOS transistor 78N having its source pulled to the ground voltage Vss.

If the MOS transistors 78P and 78N have impedance matching with the mount board 2, it is possible for this sending terminal to reduce the signal reflection. Actually, however, complete matching of impedance is difficult due to the disparity of LSI manufacturing process and the kind of mount board 2 used. Therefore, impedance controlling MOS transistors 79P and 79N are connected in series to the usual output buffer MOS transistors 78P and 78N, respectively. These MOS transistors 79P and 79N operate by having input voltage signals provided by an impedance control voltage generator 80 to vary their conduction resistance. By setting the voltage signals appropriately, signal reflection can be alleviated. The control voltage signals may be supplied from another circuit (not shown) on the mount board 2, or from the outside of the board 2. An alternative scheme is to employ a circuit in the MCU 3, so that it measures the reflection voltage and modifies the control voltage signals in response to the measurement result on a feedback basis.

The impedance controlling MOS transistors 79P and 79N may be each actually made up of, for example, multiple MOS transistors in parallel connection to have the conduction resistance determined depending on the number of transistors in the turn-on state. In this case, the impedance control voltage generator 80 produces individual gate control signals for the parallel MOS transistors to meet the intended conduction resistance.

The arrangement of the memory I/O circuit 72 explained above can be applied to the input buffers and output buffers of the RAM 7 so that the data transaction speed is further enhanced. The compact ESD circuit 77 enables a same chip area to include an increased number of input buffers and output buffers, facilitating the increase of the number of bits of input/output data, whereby the performance of high-speed data transfer or data access, for which the exclusive memory bus 12 is already adopted, can further be enhanced.

The foregoing MCM 1 attains the following effectiveness.

(1) Using the MCM 1 for system development enables the setup of an intended logic function to the FPGA 8 based on logic definition data. Particularly, it becomes possible to simulate a hardware-based function to be realized, whereby the debugging at early stages of system development is facilitated and a prototype system can be configured.

(2) The MCU 3 incorporating the flash memory 16 for storing the operation program can simulate a software-based system to be realized, whereby also from this viewpoint the debugging is facilitated and a prototype system can be configured.

(3) Based on the sharing of the system bus 13 by the MCU 3 and FPGA 8, the CPU 15 or microcomputer 3 can readily operate on the FPGA 8 to function as its peripheral circuit.

(4) Providing another flash memory 11 in connection to the system bus 13, separately from the on-chip flash memory 16 of MCU 3, enables system debugging by loading arbitrary control data tables or debug control programs of the CUP 15 or MCU 3.

(5) Based on the provision of the MCU 3 with the memory buffer 17 which is connected to the RAM 7 through the exclusive memory bus 12 without having the bus 12 connected with the system bus 13 and external connection pins of the mount board 2, it becomes possible to set up easily the number of bits of bus, the signal level of bus and the bus drive scheme so as to be adaptive to the interface norm of the RAM 7 used thereby to meet the demand of high-speed memory access by the CPU 15.

(6) The memory buffer 17 has its output buffer 78 provided with the output impedance controlling MOS transistors 79P and 79N in serial connection to the respective output MOS transistors, and it can have easy impedance matching with the exclusive memory bus 12 as data transfer lines based on the control of conduction resistance of the transistors 79P and 79N.

(7) Using a glass substrate which is as small in warping and dimensional change as silicon and lower in cost than silicon enables the precise formation of lines and thru-holes of the mount board based on the photolithographic process, and eventually enables the high-density mounting of electronic component parts including semiconductor devices.

(8) Based on these affairs, it becomes possible to debug a system amid the development or at early stages of development at virtually the same operational speed as the actual system. Consequently, semiconductor devices on the high-density mount board can be prevented from undergoing huge alterations at large-scale production following the development. The electronic circuit device based on the MCM 1, when it is intended to be a commercial product to replace a SOC-based LSI, is advantageous overwhelmingly in terms of cost reduction, particularly in the case of small-quantity large-variety production, and it is comparable to SOC in terms of performance and board size.

Figure 6:
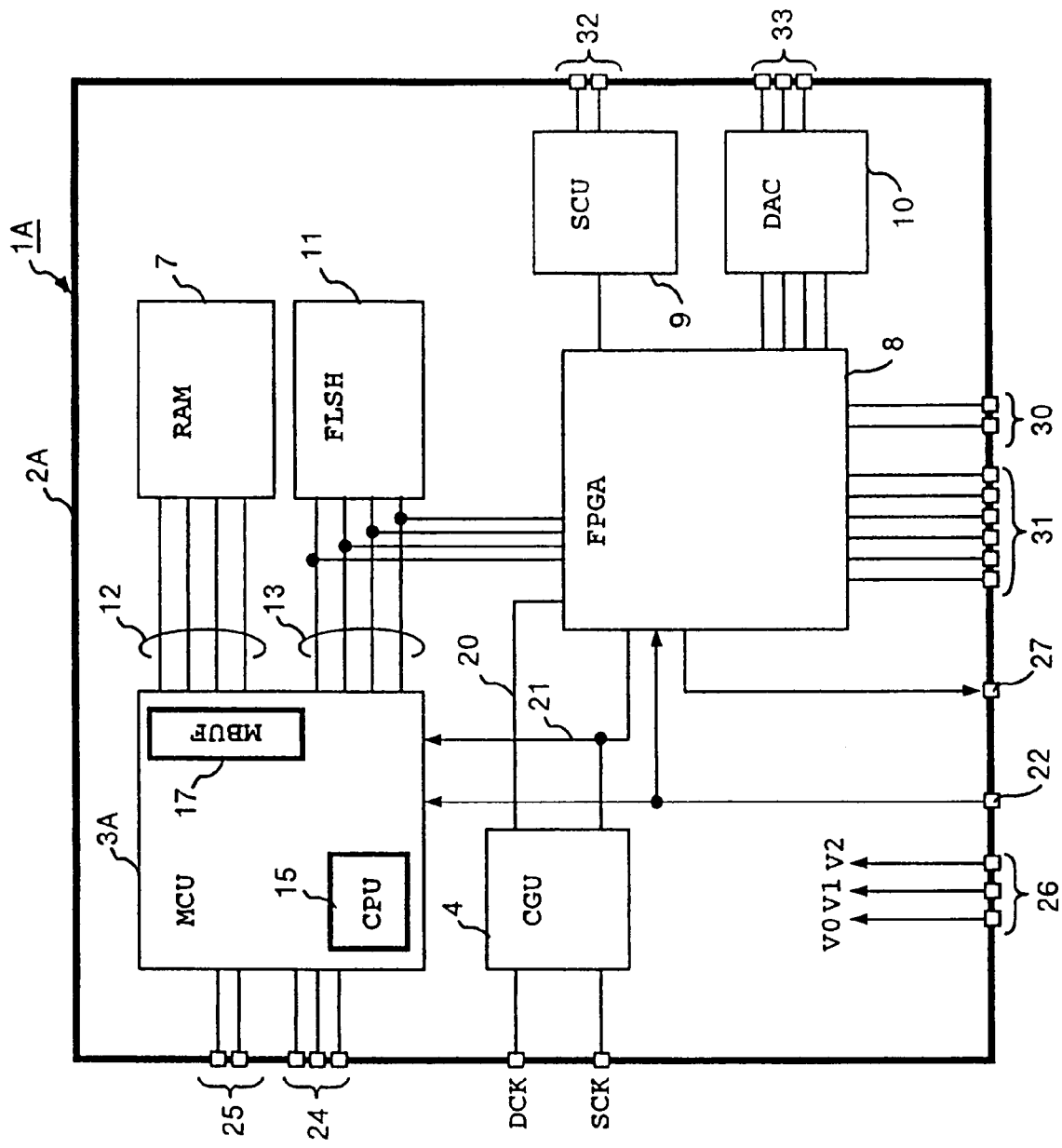
FIG. 6 is a block diagram of an MCM which is a second embodiment of the inventive electronic circuit device.

FIG. 6 shows an MCM 1A which is the second embodiment of the inventive electronic circuit. This MCM 1A differs from the MCM 1 shown in FIG. 1 in the adoption of an MCU 3A which does not have the on-chip flash memory 16. The MCU is generally designed to incorporate the flash memory in case the high-speed operation of flash memory is intended or in case the confinement of high secrecy data within the LSI chip is intended. If these cases are not relevant, it is enough to use the MCU 3A without a flash memory.

Another elimination is the SWU 6 and PCU 5, and the operational power voltages V0, V1 and V2 are supplied directly from the outside. The program-end signal 27 is released from the mount board 2A to the outside, and the system reset signal 22 is given from the outside of the board 2A. The rest is the same as the preceding one shown in FIG. 1, and further explanation is omitted.

Figure 7:
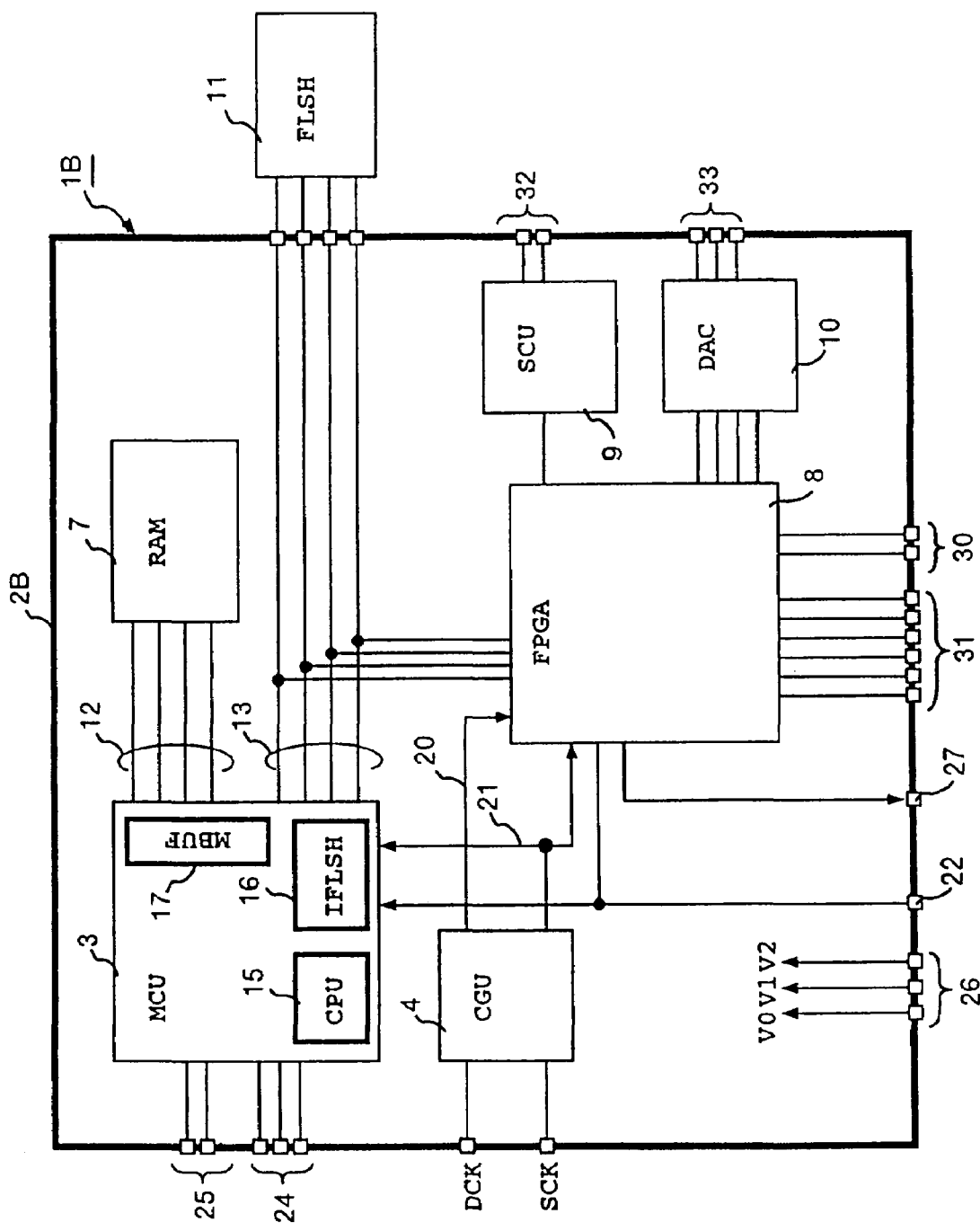
FIG. 7 is a block diagram of an MCM which is a third embodiment of the inventive electronic circuit device.

FIG. 7 shows an MCM 1B which is the third embodiment of the inventive electronic circuit. This MCM 1B differs from the MCM 1 shown in FIG. 1 in the external connection of the flash memory 11 outside of the mount board 2B. The flash memory 11 and MCM 1B are mounted on the mother board 46. The flash memory is generally very slow in access speed relative to the memory bus, and therefore it can be outside of the mount board 2B unless otherwise required by the application system. Moreover, in case a significant difference in the storage capacity of the flash memory 11 depending on the application is anticipated, it is advantageous to have the flash memory 11 outside of the mount board 2 so as to gain the system flexibility.

Another elimination is the SWU 6 and PCU 5, and the operational power voltages V0, V1 and V2 are supplied directly from the outside. The program-end signal 27 is released from the mount board 2B to the outside, and the system reset signal 22 is given from the outside of the board 2B. The rest is the same as the preceding one shown in FIG. 1, and further explanation is omitted.

Figure 8:
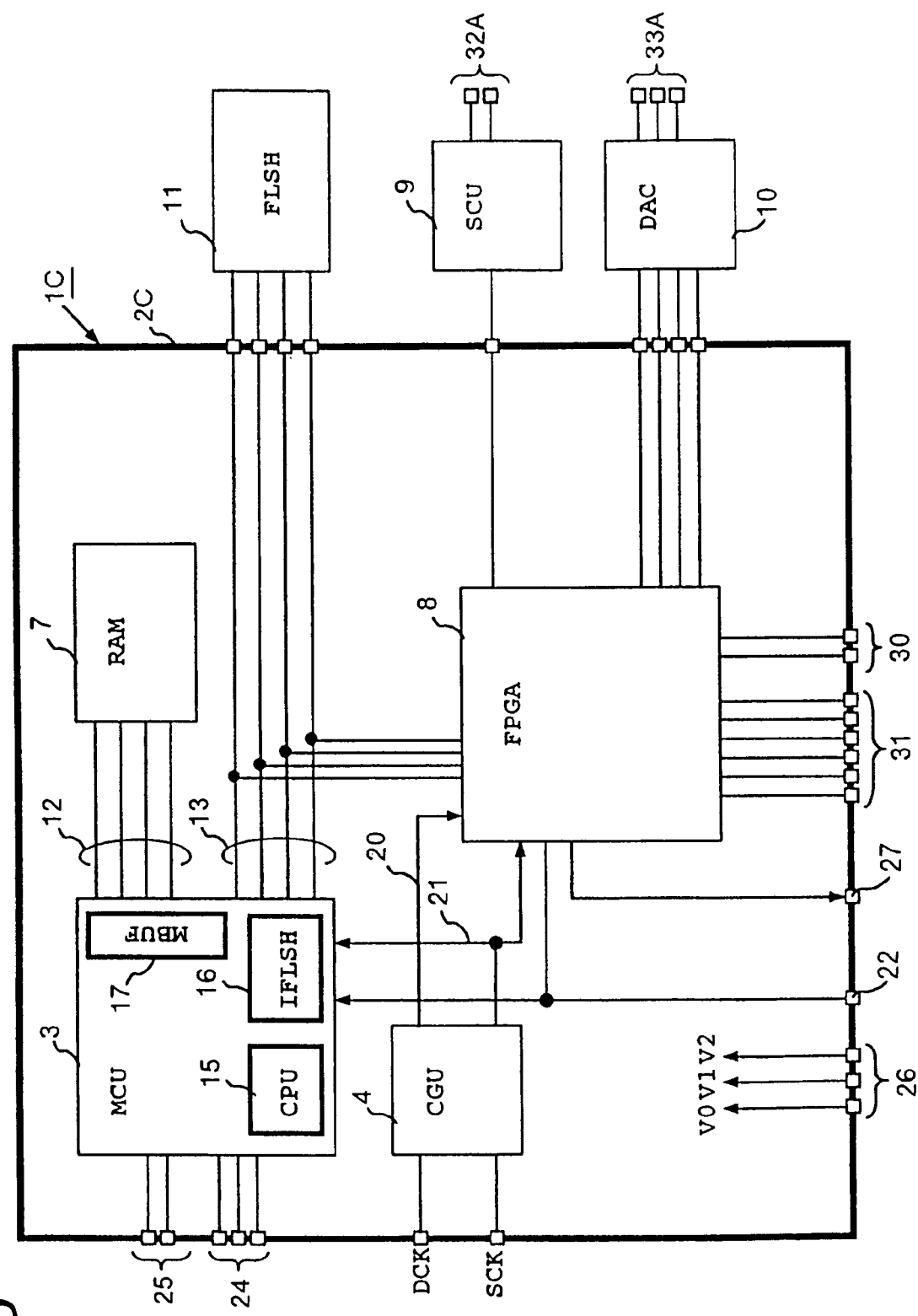
FIG. 8 is a block diagram of an MCM which is a fourth embodiment of the inventive electronic circuit device.

FIG. 8 shows an MCM 1C which is the fourth embodiment of the inventive electronic circuit. This MCM 1C differs from the MCM 1B shown in FIG. 7 in the external connection of the SCU 9 and DAC 10 in addition to the flash memory 11 outside of the mount board 2C, leaving only the MCU 3, RAM 7, CGU 4 and FPGA 8 mounted on the mount board 2C of MCM 1C. The flash memory 11, SCU 9, DAC 10 and MCM 1B are mounted on the mother board 46. In the case of making a base mount board which is allowed for logical alteration so as to be adaptive to versatile application systems, it is advantageous to mount only semiconductor devices of high commonality on the mount board 2C. Accordingly, with respect to FPGA 8, the external connection outside of the mount board 2C is not limited to the SCU and DAC shown in FIG. 8.

Figure 9:
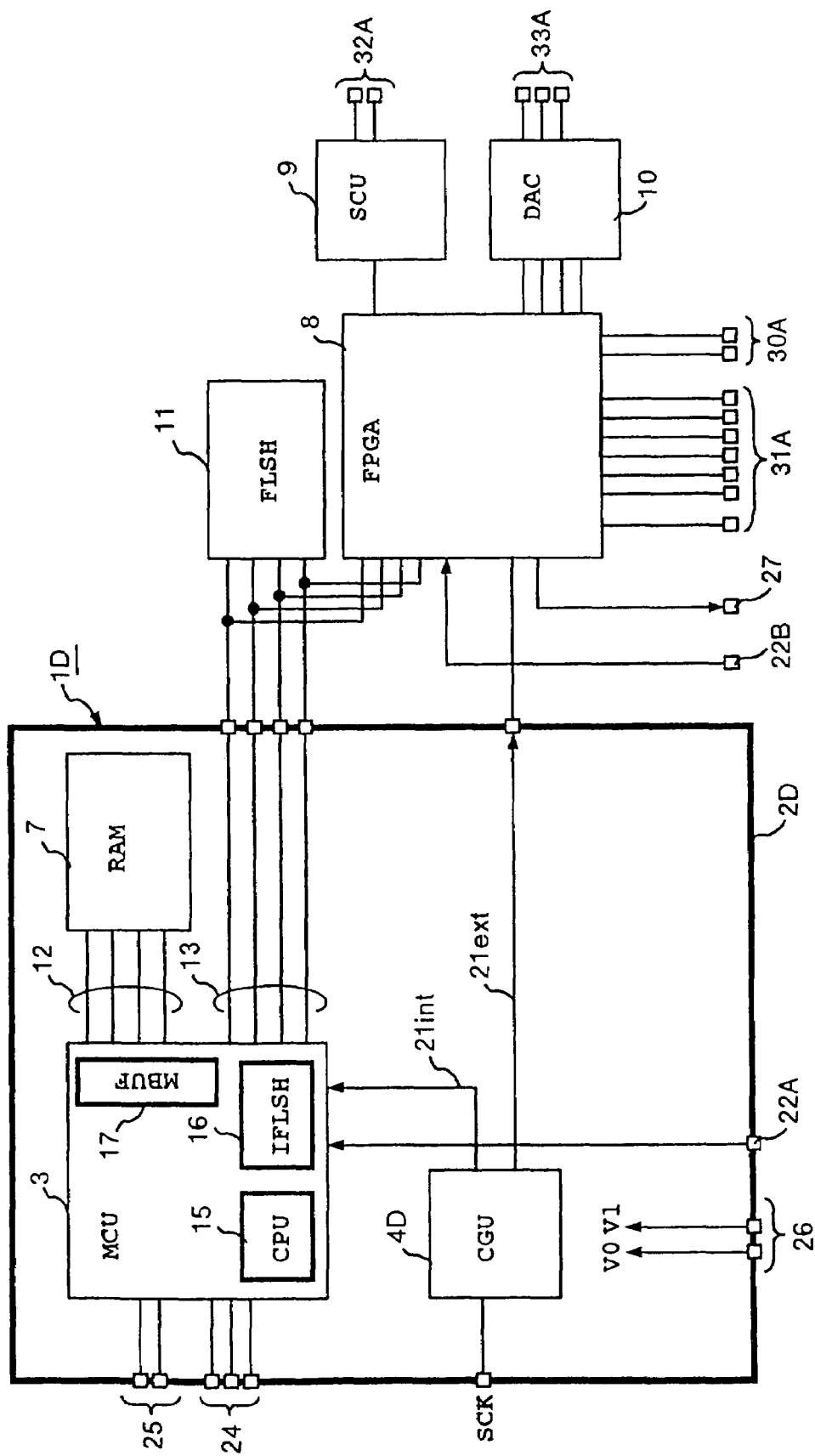
FIG. 9 is a block diagram of an MCM which is a fifth embodiment of the inventive electronic circuit device.

FIG. 9 shows an MCM 1D which is the fifth embodiment of the inventive electronic circuit. In contrast to the MCM 1C shown in FIG. 8, the MCM 1D used in this electronic circuit device has its FPGA 8 placed outside of the mount board 2D. The CGU 4D produces from the system clock signal SCK an internal clock signal 21int and external clock signal 21ext to be supplied to the MCU 3 and FPGA 8, respectively. The MCU 3 and FPGA 8 are given separate reset signals 22A and 22B. The flash memory 11, FPGA 8, SCU 9, DAC 10 and MCM 1D are mounted on the mother board 46. Shown in FIG. 8 is the minimum configuration of MCM which is allowed for logical alteration based on the use of FPGA, whereas shown in FIG. 9 is the minimum configuration of MCM which is allowed for logical alteration based on the use of flash memory 16 within the MCU.

The arrangement without mounting of the FPGA 8 on the mount board 2D is effective in case where the scale of logic circuit to be mounted on the FPGA is unknown or the variation of scale is anticipated. Mounting a large-scale logic circuit on the FPGA 8 necessitates a large FPGA 8, resulting in an increased cost, and separating the FPGA 8 from the mount board 2D can prevent the MCM from cost rising.

Figure 10:
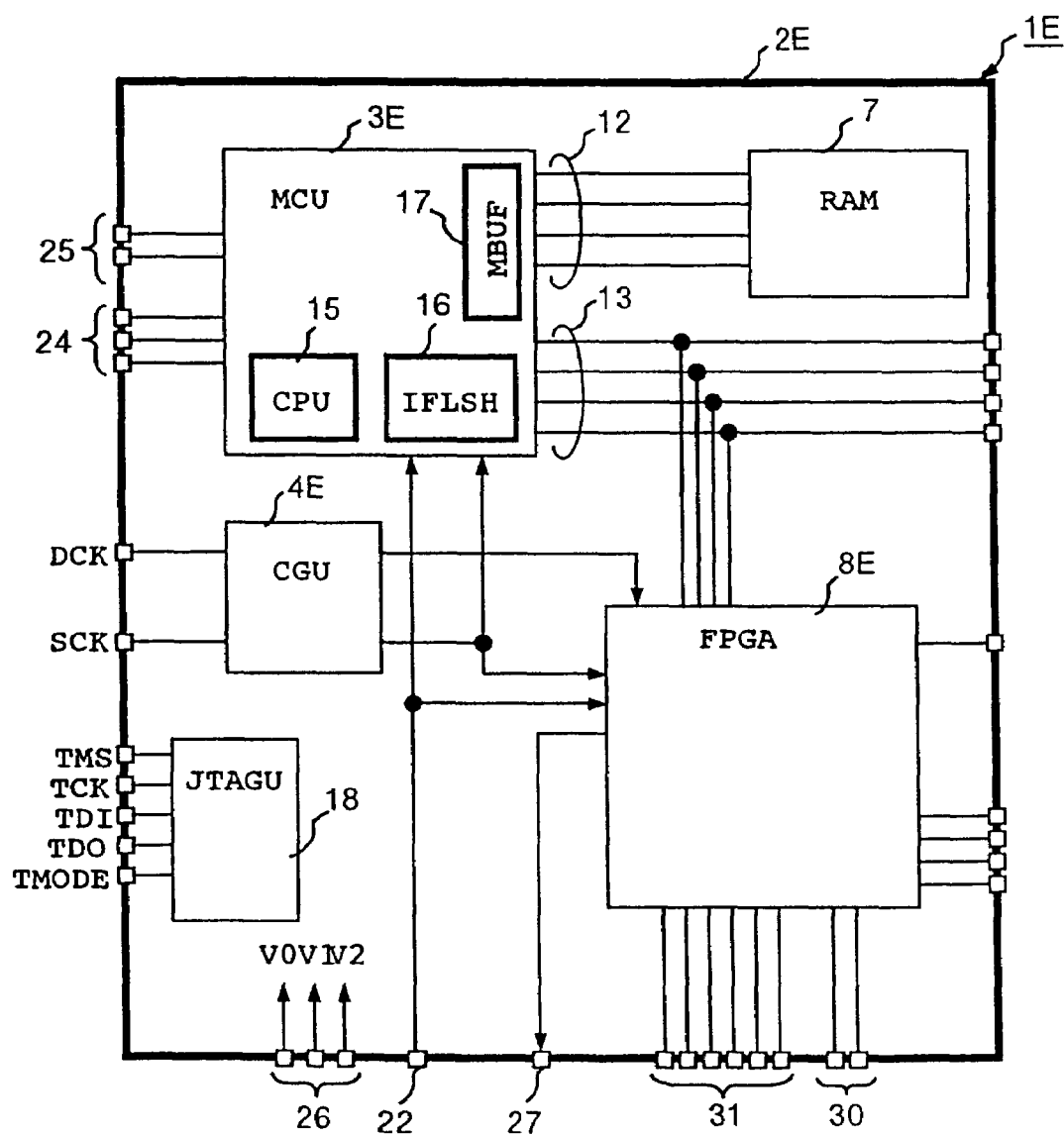
FIG. 10 is a block diagram of an MCM which is a sixth embodiment of the inventive electronic circuit device.

FIG. 10 shows an MCM 1E which is the sixth embodiment of the inventive electronic circuit. This MCM 1E differs from the MCM 1C shown in FIG. 8 in that there is mounted a JTAG control unit (JTAGU) 18, and that the MCU 3E, CGU 4E and FPGA 8E mounted on the mount board 2E each have the boundary scanning function or built-in test function based on JTAG.

Generally, when semiconductor devices are mounted face-down on a mount board, the tester probe cannot be brought in direct contact with external pins of the semiconductor devices for inspecting the connection between their pins and the micro-bumps of the mount board. Therefore, the connection is inspected by use of X rays, or based on the operation of the circuit, or by the JTAG function equipped on the semiconductor devices. Some semiconductor devices such as the MCU have a debugging function for putting in and out the device state by using the JTAG port. The arrangement of FIG. 10 is intended to use such boundary scanning function or built-in test function.

Figure 11:
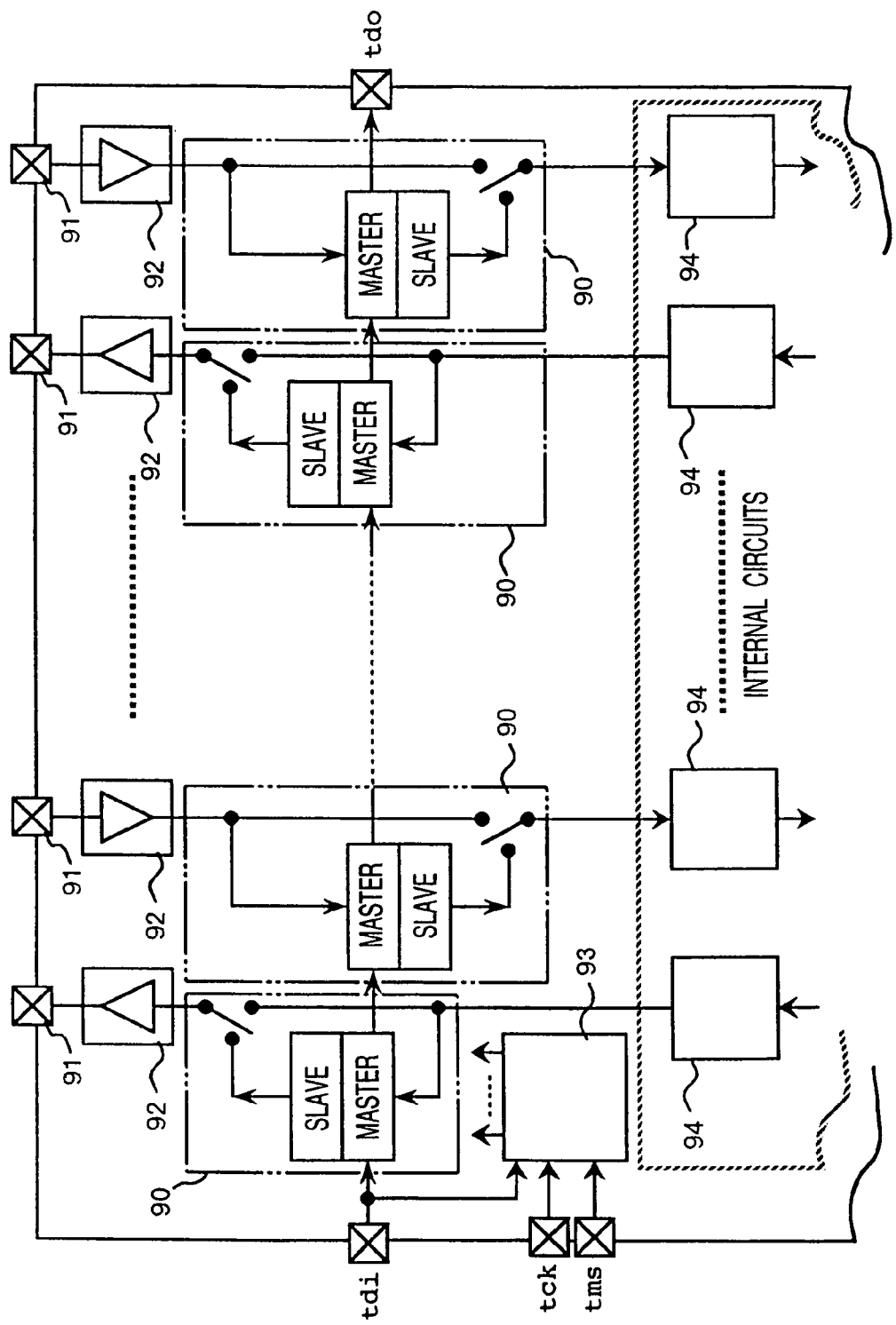
FIG. 11 is a block diagram showing in brief the JTAG structure of a semiconductor device.

First, the arrangement of JTAG equipped on the MCU 3E, CGU 4E and FPGA 8E will be explained with reference to FIG. 11. The external signal pins 91 are internally connected with boundary scanning cells 90 which are scanning latches, although this affair is not compulsory. Indicated by 92 are buffers. Each boundary scanning cell 90 has a master/slave configuration. The boundary scanning cells 90 have their master stages connected in series to form a boundary scanning register which functions as a shift register. The boundary scanning register has its input connected to a test data input pin tdi and its output connected to a test data output pin tdo. The master stages of boundary scanning cell 90 have a shift operation, while having data input from the external pin or from the internal circuit. The slave stages put out data to the external pins or to the internal circuits. The master stages and slave stages have their operation controlled by a boundary scanning control circuit 93. Unless the boundary scanning operation mode is set, the output pins are connected directly to the internal circuits, with the boundary scanning cell function being deactivated. The internal circuits shown for example in FIG. 11 are port registers 94.

The pins tdi and tdo are interface terminals of the boundary scanning register with the outside, the pin tck is a terminal of sync clock for the test operation, and the pin tms is a terminal of control signal for making a state transition in synchronism with the tck clock.

The boundary scanning control circuit 93, which receives the input signals on the tck and tms pins, switches the control state depending on the logic level "0" or "1" of the tms signal in synchronism with the tck clock. The circuit 93 decodes a resulting status and controls the operation of the scanning latches 90 in accordance with the result of decoding. Instruction data which determines the test mode is loaded from the tdi pin into the boundary scanning control circuit 93, which decodes the data to determine the test mode. The test operation in accordance with the determined mode is switched according to the status of the circuit.

Figure 12:
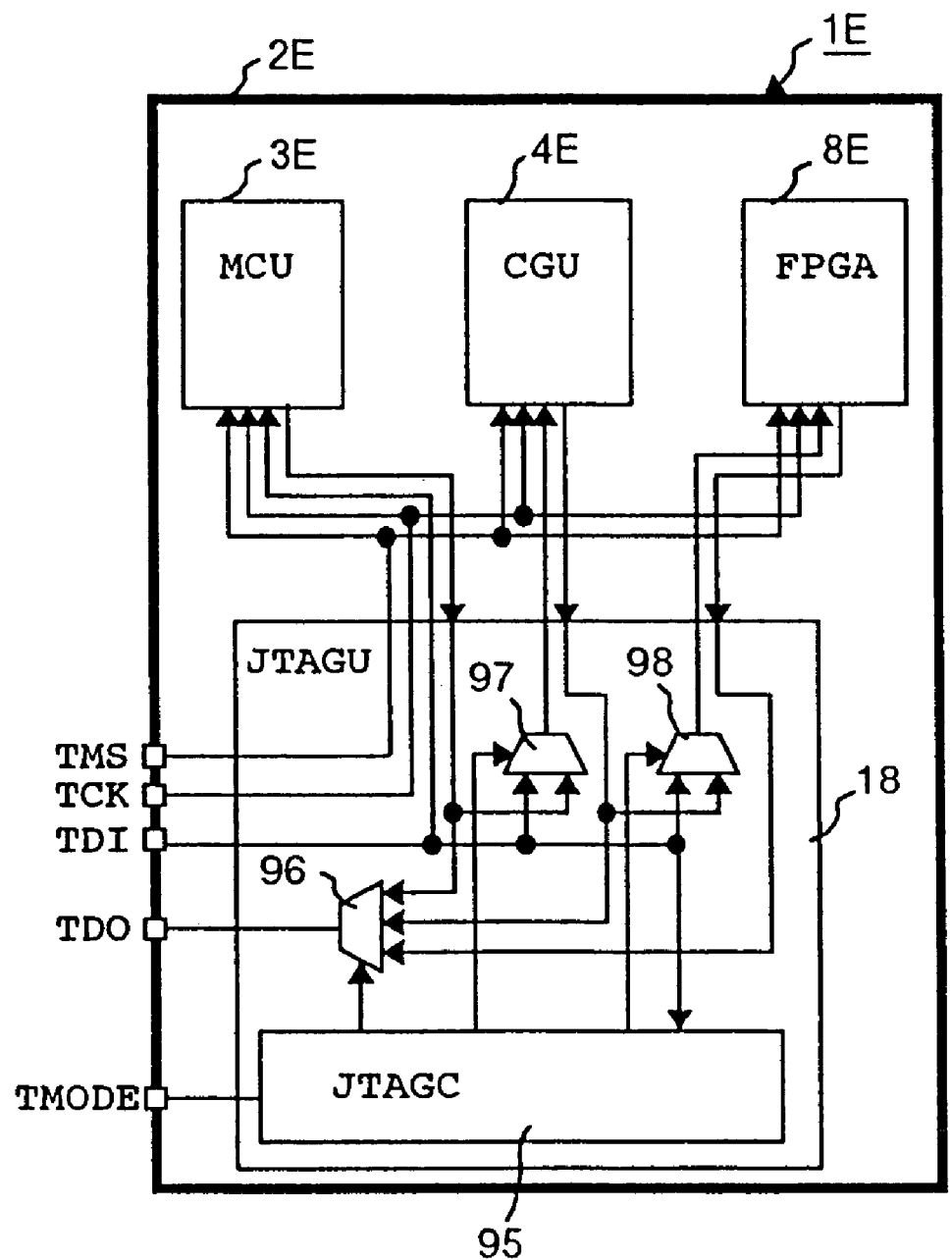
FIG. 12 is a block diagram of an MCM, showing mainly the connection between semiconductor devices and a JTAG unit which is provided for the boundary scanning function of the semiconductor devices.

FIG. 12 shows by block diagram the MCM 1E, showing mainly the connection between the semiconductor devices and the JTAGU 18 which is provided to implement the boundary scanning function of the semiconductor devices. The JTAGU 18 has common test control pins TMS and TCK which are connected in parallel fashion to the test control pins (tms and tck) of the MCU 3E, CGU 4E and FPGA 8E, a common test data input pin TDI, a common test data output pin TDO, a JTAG controller (JTAGC) 95, and selectors 96-98. The data input pin TDI is connected to the data input terminal tdi of the boundary scanning register of the MCU 3E and the data input terminal of one of the selectors 97 and 98. The boundary scanning register of MCU 3E has its data output terminal tdo connected to another data input terminal of selector 97 and the first data input terminal of selector 96. The boundary scanning register of CGU 4E has its data output terminal tdo connected to another data input terminal of selector 98 and the second data input terminal of selector 96. The boundary scanning register of FPGA 8E has its data output terminal tdo connected to the third data input terminal of selector 96. The selector 96 has its output terminal connected to the data output pin TDO. The JTAGC 95 determines the selection of the selectors 96-98 in response to serial mode data put in to the mode pin TMODE. States of selection of the selectors 96-98 include a serial connection state in which the boundary scanning registers of the semiconductor devices 3E, 4E and 8E are connected in series between the common test data input pin TDI and the common test data output pin TDO, a first separate connection state in which the boundary scanning register of the semiconductor device 3E is connected between the common test data input pin TDI and the common test data output pin TDO, a second separate connection state in which the boundary scanning register of the semiconductor device 4E is connected between the common test data input pin TDI and the common test data output pin TDO, a third separate connection state in which the boundary scanning register of the semiconductor device 8E is connected between the common test data input pin TDI and the common test data output pin TDO.

When the semiconductor devices 3E, 4E and 8E are mounted face-down on the mount board 2E, it is difficult to check visually the state of connection between the devices and the board. The inspection of electrical connection between the semiconductor devices 3E, 4E and 8E and the mount board 2E is carried out as follows. With the mount board 2E being set on the tester, the mode signal TMODE is given so that the JTAGC 95 selects the serial connection state. The tester feeds test data to the external pins of the semiconductor devices 3E, 4E and 8E on the mount board 2E so that the scanning latches of external pins of the devices hold the data. The scanning latches are operated to shift data, and the data is put out from the common test data output pin TDO to the tester. The tester compares the returned data with the test data, thereby confirming the electrical connection between the semiconductor devices 3E, 4E and 8E and the mount board 2E.

Debugging of the semiconductor device MCU 3E is carried out as follows. The tester operates on the MCM 1E so that the JTAGC 95 selects the first separate connection state. The tester feeds sample data to the scanning latches of the device MCU 3E, and the latches shift the data and put out from the common test data output pin TDO to the tester. The tester analyzes the received data. For debugging the semiconductor device CGU 4E, the JTAGC 95 is operated to select the second separate connection state, or for debugging the semiconductor device FPGA 8E, the JTAGC 95 is operated to select the third separate connection state.

As described, mounting the JTAGU 18 on the mount board 2E enables the device connection check based on the boundary scanning among the semiconductor devices on the board 2E. By switching the selection state by the TMODE signal, the debugging function of the semiconductor devices by use of the JTAG port can be used.

Figure 13:
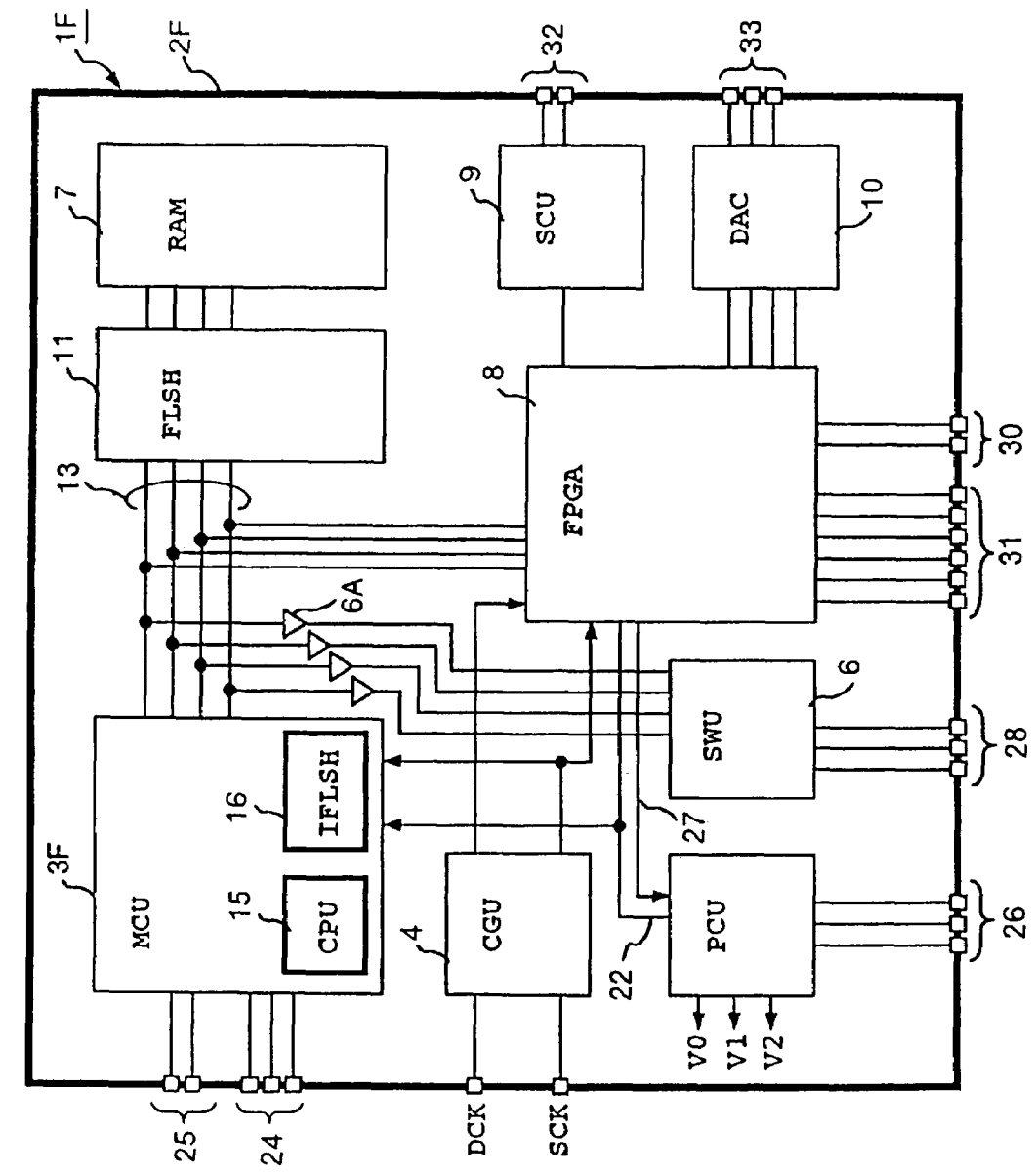
FIG. 13 is a block diagram of an MCM which is a seventh embodiment of the inventive electronic circuit device.

FIG. 13 shows an MCM 1F which is the seventh embodiment of the inventive electronic circuit. This MCM 1F differs from the MCM 1 shown in FIG. 1 in that the RAM 7 is connected commonly to the system bus 13, instead of having the exclusive memory bus 12 for it. The rest is the same. The MCU 3F does not need the memory buffer 17. In exchange for the limited high-speed access to the RAM by the MCU 3F, which does not matter for data processing of moderate speed, the MCM 1F can be reduced in cost.

It is also possible for the MCM without having the exclusive memory bus 12 to adopt the MCU without the on-chip flash memory 16 as in the case shown in FIG. 6, have the flash memory 11 outside of the mount board as shown in FIG. 7, have the SCU 9 and DAC 10 outside of the mount board as shown in FIG. 8, have the FPGA 8 outside of the mount board as shown in FIG. 9, and have the JTAGU 18 mounted on the mount board as shown in FIG. 10, although this arrangement is not shown.

Figure 14:
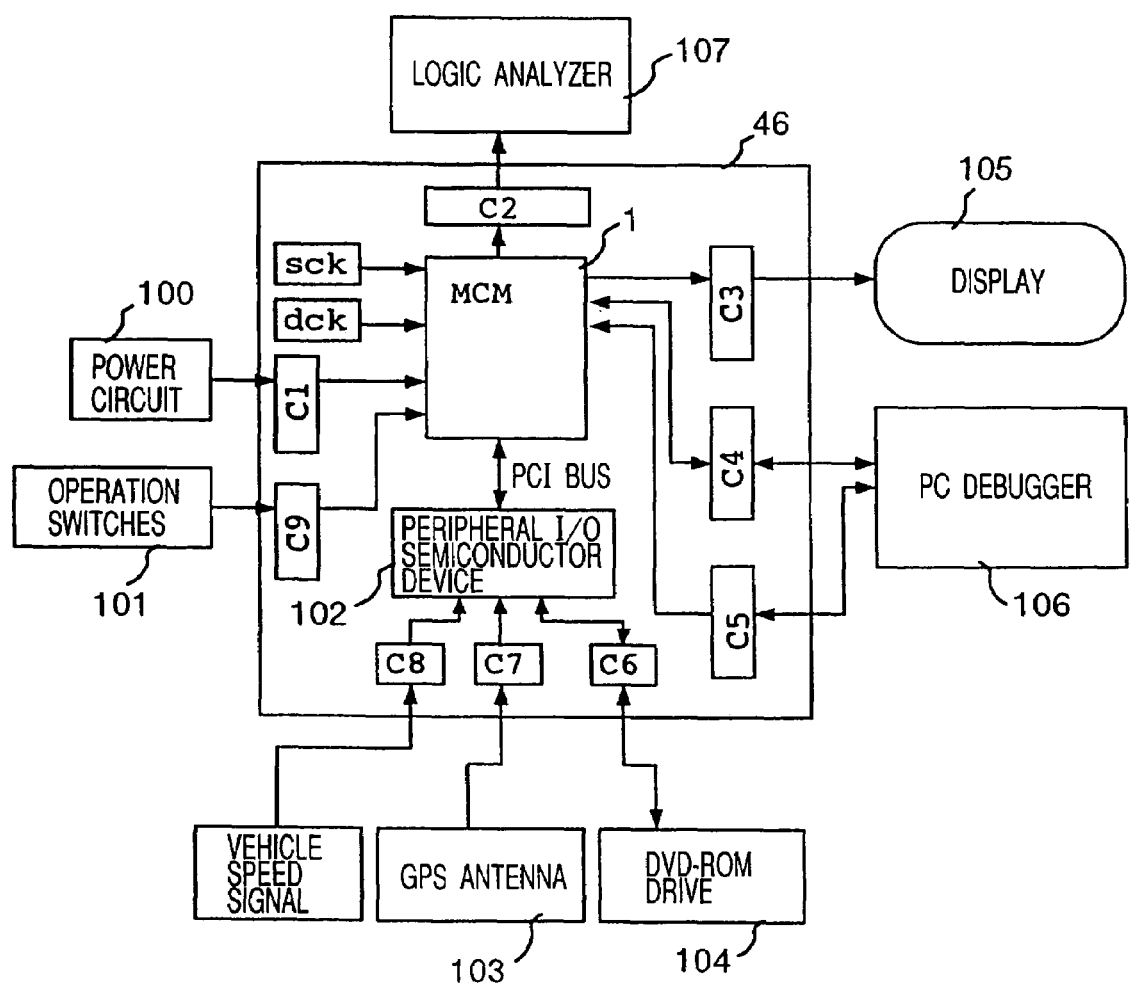
FIG. 14 is a block diagram showing the arrangement of an automobile navigation system in which the MCM shown in FIG. 1 is used for debugging the system.

FIG. 14 shows by block diagram the arrangement of an automobile navigation system, in which the MCM 1 explained on FIG. 1 is used for debugging the system. The MCM 1 is mounted on the mother board 46.

The mother board 46 includes a crystal oscillator sck for producing a system clock SCK and another crystal oscillator dck for producing a display clock DCK, with both clock signals being delivered to the MCM 1. The MCM 1 is supplied with the power voltages from a power supply circuit 100 via a connector C1. Signals from operation switches 101 are put in to a serial communication port 9 of the MCM 1 via a connector C9.

A vehicle speed signal is put in to a peripheral I/O semiconductor device 102 via a connector C8. The MCU 3 on the MCM 1 can make access to the peripheral I/O device 102 via a PCI bus port 31 of the FPGA 8, thereby reading out the vehicle speed signal.

A GPS antenna 103 is used to receive the GPS (Global Positioning System) radio waves from multiple satellites, and it converts the received signals into digital data and puts into the peripheral I/O semiconductor device 102 via a connector C7. The MCU 3 on the MCM 1 can read the signals by making access to the peripheral I/O device 102 via the PCI bus port 31 of the FPGA 8.

A DVD-ROM drive unit 104 is used to store map data, and it is connected to the peripheral I/O device 102 via a connector C6. The MCU 3 on the MCM 1 can read the map data by making access to the peripheral I/O device 102 via the PCI bus port 31 of the FPGA 8.

A display device 105 is connected to an RGB analog signal port 33 of the MCM 1 via a connector C3. The display device 105 displays the image of a map on its screen in accordance with color data of red, green and blue and horizontal and vertical sync signals superimposed on the green signal.

A PC debugger 106 is connected to the FPGA program port 30 of PCM via a connector C4 and to the peripheral I/O port 24 via a connector C5, and it supports the debugging by writing logic definition data to the FPGA 8 and writing data and program to the flash memories 11 and 16. The PC debugger 106 has a record of logic definition data to be loaded in the FPGA 8, and it writes the data into the FPGA 8 in response to the operator's instruction. It also has a record of data and program to be loaded in the flash memories 11 and 16, and it puts out a write request of flash memories 11 and 16 via the connector C5 in response to the operator's instruction to the PC debugger 106. Upon receiving the write request via the built-in peripheral I/O port 24, the MCU 3 writes data which is appended to the write request into the flash memory 11 over the system bus 13 and writes the program into the flash memory 16.

A logic analyzer 107 is connected to an internal signal probe port 28 of the MCM 1 via a connector C2, and it fetches a selected internal signal put out from the MCM 1 to the port 28. The logic analyzer 107 displays the fetched signal on its display screen in response to the operator's instruction.

As described above, based on the mounting of the electrically-rewritable flash memories 11 and 16 and logically variable FPGA 8 on the MCM 1, the automobile navigation system can be made compact and thus can operate faster. It becomes possible to debug and inspect the system in the same condition as actual commercial product.

Figure 15:
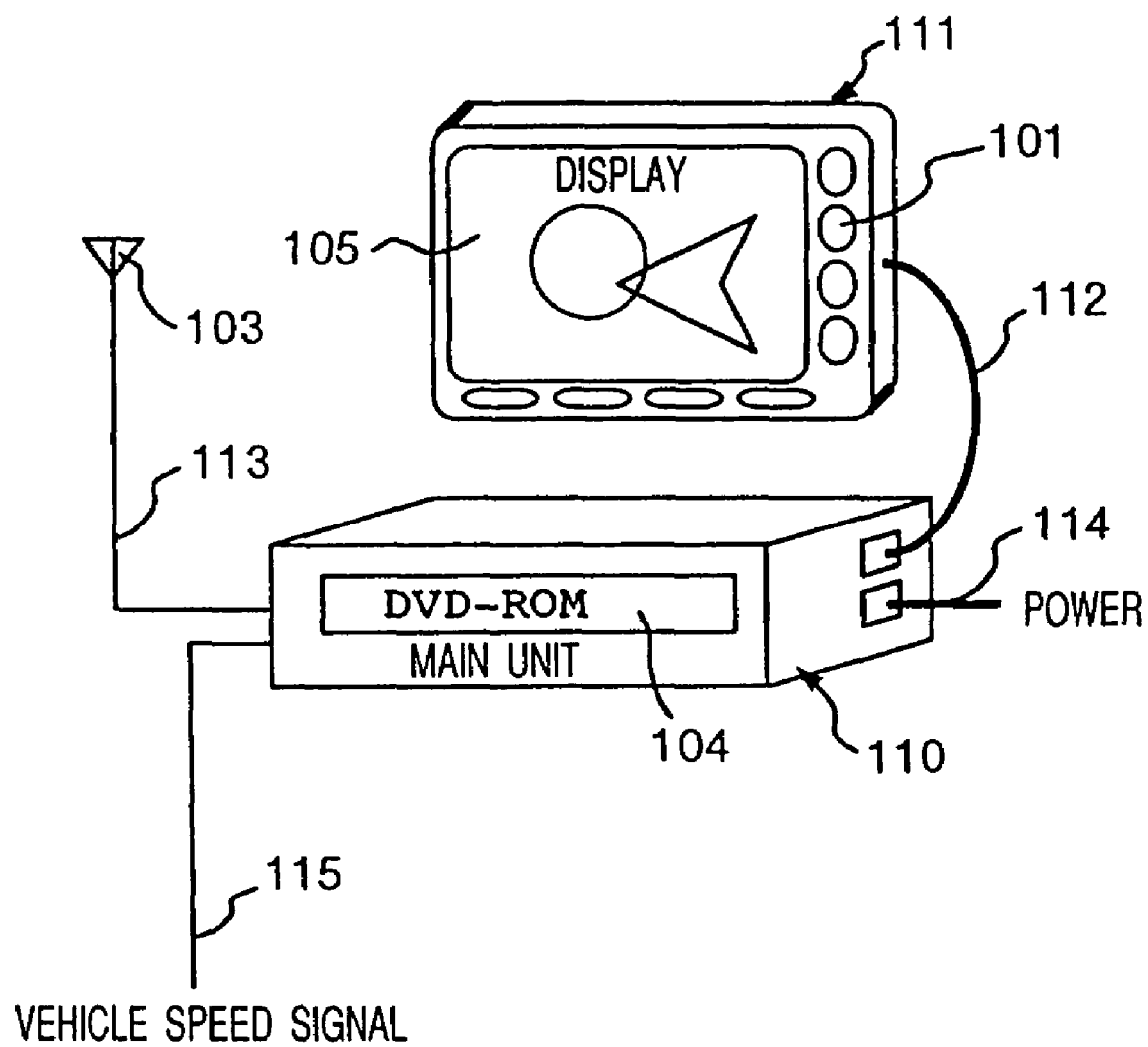
FIG. 15 is a brief external view of the automobile navigation system which uses a MCM.

FIG. 15 shows the external view of the automobile navigation system which uses the MCM 1. A main unit 110 of the system accommodates a navigation system having the function shown in FIG. 14 and arranged on the mother board 46 and a DVD-ROM drive unit 104. The main unit 110 is connected by a cable 112 to a panel unit 111 which is the combination of the operation switches 101 and the display device 105, connected by a cable 113 to the GPS antenna 103, connected for its power circuit 100 by a cable 114 to the battery of vehicle, and connected by a cable 115 to the engine control equipment to receive the vehicle speed signal.

The connectors C2, C4 and C5 shown in FIG. 14 are not used in the commercial product, in which case the program and data are stored at manufacturing in the flash memories 11 and 16. The FPGA 8 is of the nonvolatile type, or it is a semiconductor device of CBID (Cell Base IC), or it is written logic definition data from the flash memory 11, or it is written logic definition data which is read out of the DVD-ROM drive unit 104 by the MCU 3. For loading the logic definition data from the flash memory 11 to the FPGA 8, the operation mode of FPGA 8 is set over the system bus 13. For loading the logic definition data from the DVD-ROM drive unit 104 to the FPGA 8, it is temporarily written to the flash memory 11 and subsequently transferred and loaded to the FPGA 8.

Storing in the DVD-ROM drive unit 104 both of the program and data to be written to the flash memory 11 and the logic definition data to be loaded to the FPGA 8 in this manner enables the alteration or addition of functions even after the product is completed.

Figure 16:
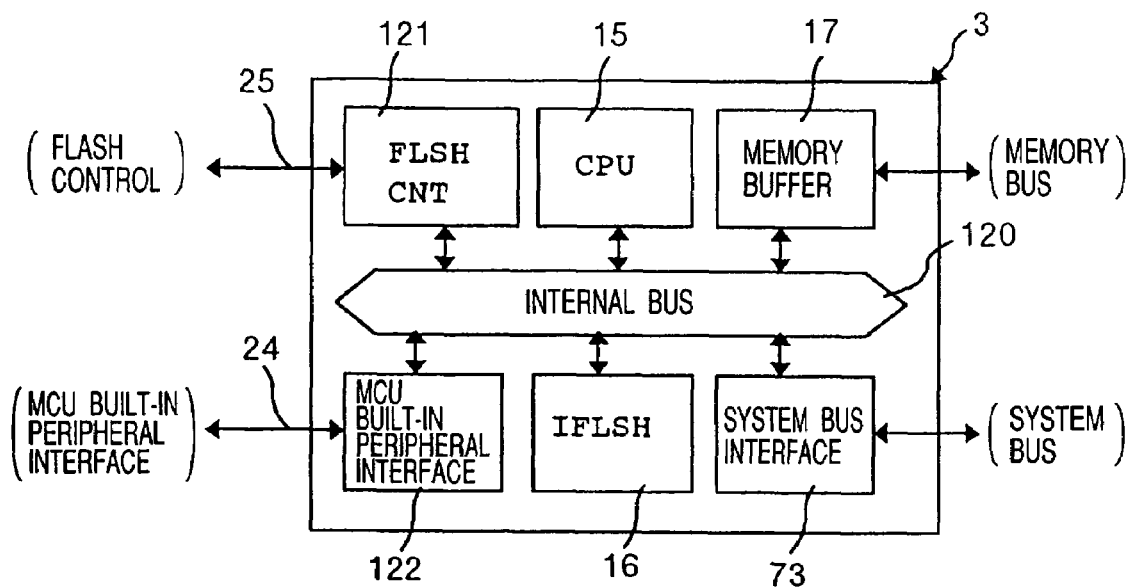
FIG. 16 is a block diagram of an MCU having an on-chip flash memory.

FIG. 16 shows an example of the arrangement of the MCU 3. The MCU 3 includes an internal bus 120, CPU 15, on-chip flash memory (IFLSH) 16, memory buffer 17, system bus buffer 73, flash memory control unit (FLSCNT) 121, and built-in peripheral circuit 122.

The CPU 15 places a memory address on the internal bus 120 to fetch a command of program and executes the command. If the address placed on the internal bus 120 is an address of the memory bus, the memory buffer 17 reads or writes data from/to the memory on the memory bus. If the address placed on the internal bus 120 is an address of the system bus, the system bus buffer 73 reads or writes data from/to the device on the system bus. The flash memory control unit (FLSCNT) 121 reads or writes data from/to the on-chip flash memory 16 if the address placed on the internal bus 120 is an address of the flash memory 16, or reads or writes data from/to the on-chip flash memory 16 over the internal bus 120 if it is instructed by the flash memory control signal from the outside. The MCU built-in peripheral circuit 122 operates on the internal bus 120 to carry address or data in response to the external instruction through the MCU peripheral interface 24.

Usually, when the system is turned on and reset, the CPU 15 starts to read the program at a predetermined address of the flash memory 16, of the memory on the memory bus, or on the system bus.

In case, the program is stored in the on-chip flash memory 16, it is possible without the operation of the CPU 15 to enable the read/write of the on-chip flash memory 16 in response to the flash memory control signal via the program pin 15 when the MCU 3 is turned on and reset.

In the case of writing the flash memory 16 after the CPU 15 starts operating following the reset, writing is possible by the output of an address of the flash memory 16 from the CPU 15 or from the MCU built-in peripheral circuit 122.

The memory buffer 17 of MCU can be eliminated when the connection to the exclusive memory bus 12 is not necessary. The FLSHCNT 121 is not necessary when the flash memory 16 is not mounted on the MCU 3.

Figure 17:
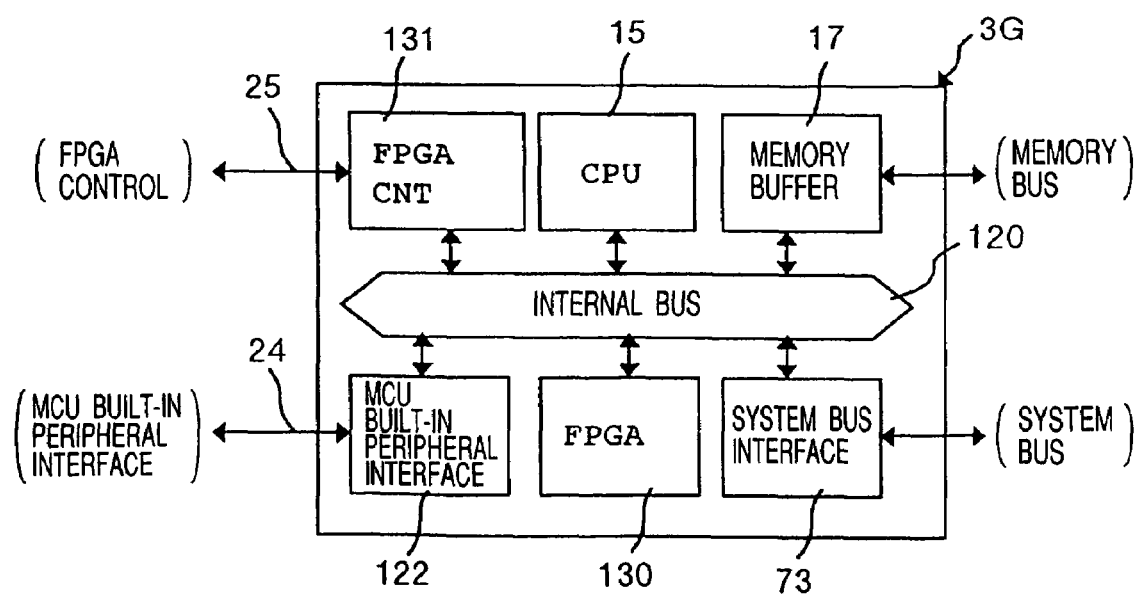
FIG. 17 is a block diagram of an MCU having a built-in FPGA.

FIG. 17 shows an example of the arrangement of an MCU 3G which incorporates the FPGA. The MCU 3G differs from the MCU 3 shown in FIG. 16 in the inclusion of a FPGA 130 and FPGACNT 131 in place of the IFLSH 16 and FLSHCNT 121. The CPU 15 places a memory address on the internal bus 120 to fetch a command of program and executes the command. The FPGA control unit (FPGACNT) 131 reads or writes data from/to the FPGA 130 if the address placed on the internal bus 120 is an address of the FPGA 130, or reads or writes data from/to the FPGA 130 over the internal bus 120 if it is instructed by the FPGA control signal from the outside via the program pin 25.

In case, logic definition data is stored in the FPGA 130, it is possible without the operation of the CPU 15 to enable the writing of FPGA 130 in response to the instruction via the control pin 25 when the MCU 3G is turned on and reset. On completion of writing, the reset state is lifted to start the operation of the whole system inclusive of the FPGA 130.

In the case of writing data to the FPGA 130 after the CPU 15 has started operating, it can be done by releasing an address of FPGA 130 from the CPU 15 or MCU built-in peripheral circuit 122. On completion of writing to the FPGA 130, it can start operating by receiving an active signal (not shown) from the FPGACNT 131 in response to the instruction from the CPU 15.

The arrangement of FIG. 17 enables the FPGA 130 to establish an intended logic function variably, whereby the speed-up of operation more than the case of mounting the FPGA 8 on the mount board is made possible. Since the logic definition data stored in the FPGA 130 can be rewritten arbitrarily, the on-chip provision of FPGA 130 shown in FIG. 17 is much desirable in terms of secrecy.

FIG. 18 shows an example of the arrangement of the MCU 3H which incorporates on-chip both of the FPGA 130 and flash memory 16. In consequence, logic definition data of the on-chip FPGA 130 can be stored in the on-chip flash memory 16, and it becomes possible to initialize the FPGA 130 without access from the outside by writing the logic definition data from the flash memory 16 into the FPGA 130 automatically at the time of power-on. In a system design in which the on-chip flash memory 16 and on-chip FPGA 130 are used for debugging and the flash memory 16 is replaced with a mask ROM and the on-chip FPGA 130 is replaced with a micro-controller MCU formed of a logic gate circuit at the time of scale production, the mount board itself does not need any alteration. Whereas, when the FPGA is not on-chip as shown in FIG. 1, the mount board more or less necessitates the modification unless the external pins have the electrical and physical compatibility when the FPGA 8 is replaced with the ASIC.

FIG. 19 shows by flowchart in brief the development procedures from the planning of development of an electronic circuit device until the fabrication of a prototype system. First, the production of an application system is planned, and the specifications of the system is determined: (step S1). The planned system is shaped at least to the extent of drawing a functional block diagram: (step S2). For functional blocks, their peripheral functions are defined based on a logical description language such as RTL, and the CPU operation for implementing the functions of the blocks is programmed based on a high-class programming language such as the C language: (step S3). The electronic circuit device is debugged during the development based on a prototype system using the MCM1 explained on FIG. 1 for example: (step S6). Logic functions are set to the FPGA of MCM 1 in accordance with the logical description data: (step S4). The CPU program is written to the MCU on-chip flash memory: (step S5). The periodical function to be developed is implemented progressively while being debugged by the FPGA, and the system function implemented by the program in the on-chip flash memory takes shape progressively. The prototype system based on the programmed MCM 1 is operated for debugging cyclically, while feeding back the result of debugging to the on-chip flash memory and FPGA, so that the hardware and software structures of the device are settled. Following the configuration of the prototype system, it is recommended for small-scale production of application system to use the MCM 1 intact so that problems emerging after the delivery of the system can be treated promptly. In response to the growth of production scale or following the settlement of problems, it is possible to replace the FPGA with a semiconductor device such as ASIC and replace the on-chip flash memory with a mask ROM.

The MCM 1 may be designed further to mount analog circuits and, if possible, sensor circuits, actuator circuits or power circuit.

Although the present invention has been described in connection with the specific embodiments, the invention is not confined to these embodiments, but various alterations are obviously possible without departing from the essence of the invention. For example, the circuit arrangement of FPGA is not limited to that shown in FIG. 4. The nonvolatile memory is not limited to the flash memory, but it may be a ferrodielectric memory. The type and circuit arrangement of semiconductor devices mounted on the mount board are not limited to those of the foregoing embodiments, but they can be altered.

Although, in the embodiment shown in FIG. 1 and FIG. 2, the high-density mount board 2 is designed to mount surface-mount semiconductor devices, it may be designed to mount both of surface-mount semiconductor devices and wire-bonding semiconductor devices which are connected electrically to the board by means of connector wires. In this case, the high-density mount board is provided on its main surface with bump electrodes described previously for mounting surface-mount semiconductor devices, connection areas for fixing wire-bonding semiconductor devices, and pad electrodes in correspondence to bonding pads of semiconductor chips. In consequence, it becomes possible for the inventive electronic circuit device to use wire-bonding semiconductor devices as well as surface-mount semiconductor devices.

In case a system is mostly configured as one semiconductor device of LSI (will be called one-chip LSI), it can possibly take unexpected long development time for the system design and debugging, while on the other hand, the LSI technology which enables the minimal wiring length and wire capacitance can possibly attain a faster electronic circuit device. In contrast, an electronic circuit device of MCM structure has a remarkable feature of enabling short-time design as mentioned previously, and in addition it can be much compact as compared with the case of mounting various semiconductor devices on a usual printed circuit board. An electronic circuit device of MCM structure features to operate faster owing to the compactness, however, it can possibly be larger in size than the case of using one-chip LSI.

The arrangements of using a semiconductor chip of the microcomputer 3 with memory buffer 7 as in the cases of the foregoing embodiments shown in FIG. 1, FIG. 5 and FIG. 6 are a matter of notice in planning an electronic circuit device with operational speed characteristics comparable to one-chip LSI.

The memory buffer 7 may be designed to have a signal level converting function so as to speed up the signal propagation based on a smaller signal amplitude, in place of or in addition to the arrangement of the foregoing embodiment. Moreover, the signal form may be designed to match with the differential signal transaction scheme or complementary signal transaction scheme.

It is also possible to use an FPGA and a special-purpose logic circuit, in place of a semiconductor device of FPGA. Specifically, it is possible to form the MCU 3 and FPGA 8 on one chip. Some special-purpose electronic circuit device can have its logic function divided into a functional section which will need alterations due to the revision of version and another functional section which is unchanged. Special purposes include video data-processing, audio signal processing, and automobile control inclusive of engine control. The above-mentioned semiconductor device having a special-purpose logic circuit and FPGA is suitable for these purposes. In this case, the logic function section formed of FPGA can be made smaller, and thus the development time can possibly be reduced. Even though the FPGA tends to have a larger value in terms of logical scale per number of circuit elements due to the need of having a memory circuit for logic definition data, the feature of attaining an intended logic function at a smaller number of circuit elements without the need of variable switch cells, variable logic cells and memory circuit enables the size reduction of semiconductor device. The smaller size obviously enables the accomplishment of satisfactory electrical characteristics and also enables the cost reduction.

INDUSTRIAL APPLICABILITY

The present invention is applicable to an electronic circuit device to be used for the debugging at early stages of on-chip-based or MCM-oriented system development and also for the configuration of a prototype system, to an electronic circuit device which is complete as a commercial product, and to an MCM-oriented electronic circuit device or an electronic circuit device using an MCM.

What is claimed is:

1. An electronic circuit semiconductor device,
  a microcomputer including a CPU formed on a first chip; and
  a memory unit formed on a second chip,
  wherein said first chip and second chip are formed on one side of a common substrate of a board,
  wherein said common substrate has a plurality of external pins for connecting to another board,
  wherein said plurality of external pins are connected to said first chip,
  wherein said microcomputer includes a buffer unit for connecting to said memory unit via a memory bus,
  wherein said memory bus is formed on said common substrate without connecting to said external pins,
  wherein said buffer unit has an output buffer unit for connecting to said memory bus,
  wherein said output buffer unit includes an output transistor and an output impedance controlling transistor for connecting in series to said output transistor, and an output pin which is connected in series to said output transistor and said output impedance controlling transistor, and
  wherein said output impedance controlling transistor has its conduction impedance controlled by receiving on said gate electrode thereof a control voltage which is put out from a voltage generation unit.

2. An electronic circuit device according to claim 1,
  wherein said common substrate has a substrate and multi-wiring-layers for forming on one main surface of said substrate,
  wherein said multi-wiring-layers have on the surface thereof connection pins disposed to mount said first chip and second chip and are conductive to certain wiring lines of said multi-wiring-layers, and
  wherein another main surface of said substrate said external pins which are formed to penetrate said substrate and are connected to a wiring lines of said multi-wiring-layers.

3. An electronic circuit device according to claim 1, wherein said memory unit includes a nonvolatile memory storing a CPU program.

4. A electronic circuit device according to claim 1,
  wherein said microcomputer includes a Flash memory controller used for accessing an external Flash memory, and
  wherein said microcomputer couples with said external Flash memory via said external pins.

5. A electronic circuit device according to claim 1,
  wherein said plurality of external pins includes external power pins to provide a first power voltage and a second power voltage,
  wherein said first power voltage is provided to said microcomputer, and
  wherein said second power voltage is provided to said memory unit.

6. An electronic circuit device according to claim 1,
  wherein said memory unit includes a synchronous memory, and
  wherein said microcomputer is operable to access to said memory unit.

7. An electronic circuit device according to claim 6,
  wherein said memory unit further includes a Flash memory used for string a predetermined data.

* * * * *